United States Patent
Iida

(10) Patent No.: US 7,361,899 B2
(45) Date of Patent: Apr. 22, 2008

(54) INFRARED SENSOR, INFRARED CAMERA, METHOD OF DRIVING INFRARED SENSOR, AND METHOD OF DRIVING INFRARED CAMERA

(75) Inventor: Yoshinori Iida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 11/532,771

(22) Filed: Sep. 18, 2006

(65) Prior Publication Data

US 2007/0145274 A1 Jun. 28, 2007

(30) Foreign Application Priority Data

Dec. 27, 2005 (JP) ............... 2005-375331

(51) Int. Cl.
*G01J 5/20* (2006.01)
*H01L 27/14* (2006.01)
*H01L 31/00* (2006.01)

(52) U.S. Cl. ............... 250/336.4; 250/370.01

(58) Field of Classification Search ............ 250/338.1, 250/338.2, 338.3, 338.4, 338.5, 339.01, 339.02, 250/339.03, 339.04, 339.05, 339.06, 339.07, 250/339.08, 339.09, 339.1, 339.11, 339.12, 250/339.13, 339.14, 339.15, 341.1, 341.2, 250/341.3, 341.5, 341.6, 341.7, 341.8, 342, 250/343, 344, 345, 346, 347, 348, 349, 350, 250/351, 352, 353, 354.1, 341.4
See application file for complete search history.

(56) References Cited

U.S. PATENT DOCUMENTS 5,757,008 A * 5/1998 Akagawa et al. ...... 250/370.08
6,759,657 B2 7/2004 Iida et al.
6,770,881 B2 8/2004 Iida et al.
2002/0195563 A1* 12/2002 Iida et al. ............... 250/332
2003/0113783 A1* 6/2003 Funaki et al. ............ 435/6

FOREIGN PATENT DOCUMENTS

JP 9-37154 2/1997
JP 9-284651 10/1997

OTHER PUBLICATIONS

U.S. Appl. No. 11/228,344, filed Sep. 19, 2005, Iida.
Tomohiro Ishikawa, et al., "Low-cost 320×240 uncooled IRFPA using conventional silicon IC process", Part of the SPIE Conference on Infrared Technology and Applications XXV, Orlando, Florida, SPIE vol. 3698, Apr. 1999, pp. 556-564.
Nobuo Nakamura, et al., "Development of a Highly Sensitive CMOS Active Pixel Image Sensor", CMOS, vol. 54, No. 2, 2000, pp. 216-223 (with English Abstract).

* cited by examiner

Primary Examiner—Kimberly D. Nguyen
Assistant Examiner—Kiho Kim
(74) Attorney, Agent, or Firm—Oblon, Spivak, McClelland, Maier & Neustadt, P.C.

(57) ABSTRACT

An infrared sensor includes an imaging area including infrared detection pixels; row selection lines; a signal line; a row selection circuit generating a column voltage in the signal line; a column amplifier including a first amplifying transistor which generates an amplification voltage obtained by amplifying the column voltage and a first clamp circuit which holds threshold voltage information of the first amplifying transistor in its gate; a removing circuit including a second amplifying transistor and a second clamp circuit which holds threshold voltage information of the second amplifying transistor in its gate, the removing circuit being connected to the column amplifier to remove a bias component from the amplification voltage; and a reading circuit reading an output voltage from the column amplifier, the output voltage is obtained by excluding at least the bias component from the amplification voltage.

22 Claims, 16 Drawing Sheets

VALID PIXEL

OB (OPTICAL NON-SENSITIVITY) PIXEL

TB (THERMAL NON-SENSITIVITY) PIXEL

COLUMN AMPLIFIER CIRCUIT

BALANCE CIRCUIT

INFRARED SENSOR, INFRARED CAMERA, METHOD OF DRIVING INFRARED SENSOR, AND METHOD OF DRIVING INFRARED CAMERA

CROSS-REFERENCE TO RELATED APPLICATION

This application is based upon and claims the benefit of priority from the prior Japanese Patent Application No. 2005-375331, filed on Dec. 27, 2005, the entire contents of which are incorporated herein by reference.

BACKGROUND OF THE INVENTION

1. Field of the Invention

The present invention relates to an infrared sensor, an infrared camera, a method of driving an infrared sensor, and a method of driving an infrared camera.

2. Related Art

According to infrared imaging, it is possible to pick up images regardless of day or night, and an infrared ray has higher permeability of smoke and fog than that of visible light. Based on the infrared imaging, temperature information of a photogenic subject can be obtained. Therefore, infrared imaging has a wide application range using an infrared camera as a monitoring camera for military operations and as a fire detection camera.

A largest issue of a conventional quantum infrared solid-state imaging device is that the device requires a cooling mechanism for a low-temperature operation. In recent years, development of an "uncooled type infrared solid-state imaging device" that does not require this cooling mechanism is being progressed. The uncooled type, or heat-type, infrared solid-state imaging device converts an incident infrared ray, having a wavelength of about 10 microns, into heat in an absorption structure. After this, a certain thermoelectric converter converts a temperature change of a thermosensitive part, generated by weak heat, into an electric signal. The heat-type infrared solid-state imaging device reads out this electric signal to obtain infrared image information.

For example, an infrared sensor that uses a silicon pn junction which converts a temperature change into a voltage change, by giving a constant forward current, is reported (Tomohiro Ishikawa, et al. Proc. SPIE Vol. 3698, p. 556, 1999).

According to this system, an SOI (Silicon On Insulator) substrate is used for a semiconductor substrate. Because an infrared sensor can be manufactured in only a silicon LSI process, the infrared sensor is suitable for mass production.

The infrared sensor achieves a row selection function, by using rectification characteristic of a silicon pn junction as a thermoelectric conversion unit. Therefore, this infrared sensor also has a characteristic that a pixel configuration can be extremely simply structured.

As one of indexes that represent performance of the infrared sensor, there is NETD (Noise Equivalent Temperature Difference) which expresses temperature resolution of the infrared sensor.

The NETD shows a temperature difference that is equivalent to noise. Decreasing the NETD is important for the infrared sensor. For this purpose, it is necessary to increase the sensitivity of a signal and decrease noise.

A signal detected in an imaging area of the infrared sensor is amplified by a column amplifier, and the amplified signal is stored in a storage capacitor. Image information is obtained by reading the signal from the storage capacitor.

However, a signal that is detected in the imaging area in the actual infrared sensor is a very weak voltage in the order of micro volts. On the other hand, a voltage component necessary to provide a bias current for improvement of the gain of the column amplifier is a few hundred mV in a column amplifier input conversion. A bias current flows through an amplifying transistor of the column amplifier, regardless of presence or absence of an infrared signal.

As explained above, a most part of current stored in the storage capacitor is a bias current component, and a signal component of an infrared ray is very small. In other words, most of a voltage swing of the storage capacitor is a bias current component, and the infrared signal component is only a small part of the voltage swing.

In general, an external circuit removes the bias current component. Therefore, conventionally, a dynamic range of the column amplifier is not sufficiently used within the infrared sensor. Because a signal needs to be amplified after the external circuit removes the bias current component, a standard of noise of the external circuit other than the infrared sensor has had to be critical. Therefore, the cost of an electronic device including an infrared sensor such as an infrared camera has been high. The gain of the column amplifier cannot be sufficiently large, because the storage capacitor needs to be prevented from being saturated by a bias current component. As a technique of preventing the column amplifier from being saturated, JP-A H09-284651 (KOKAI) discloses a method of removing a current corresponding to the bias component by a MOS transistor that is drain connected to the storage capacitor.

However, a threshold value of the MOS transistor is known to have a fluctuation or variation about 30 mV. Precision of removal of the bias component is no more than about 30 mV in a column amplifier input conversion.

On the other hand, the signal component is very weak in the order of micro volts in the column amplifier input conversion, as described above. Therefore, a bias component of about 30 mV that cannot be removed remains. The gain of the column amplifier cannot be made sufficiently large. For the same reasons, the voltage swing of the column amplifier cannot be activated to the full.

SUMMARY OF THE INVENTION

An infrared sensor according to an embodiment of the present invention comprises an imaging area disposed on a semiconductor substrate and including a plurality of infrared detection pixels which detect infrared rays; row selection lines connected to the infrared detection pixels disposed in a row direction; a signal line connected to the infrared detection pixels disposed in a column direction; a constant current source connected to the signal line; a row selection circuit applying a voltage to the infrared detection pixels via the row selection line and generating a column voltage in the signal line; a column amplifier connected to the signal line, the column amplifier including a first amplifying transistor which generates an amplification voltage obtained by amplifying the column voltage and a first clamp circuit which holds threshold voltage information of the first amplifying transistor in a gate of the first amplifying transistor; a removing circuit including a second amplifying transistor which has conductivity opposite to that of the first amplifying transistor and a second clamp circuit which holds threshold voltage information of the second amplifying transistor in a gate of the second amplifying transistor, the removing circuit being connected to the column amplifier to remove a bias component generated by a bias current, which flows through the column amplifier, from the amplification voltage; and a reading circuit reading an output voltage from the column amplifier, the output voltage being obtained by excluding at least the bias component from the amplification voltage.

A driving method of an infrared sensor according to an embodiment of the present invention, the infrared sensor comprising an imaging area disposed on a semiconductor substrate and including a plurality of infrared detection pixels which detect infrared rays, row selection lines connected to the infrared detection pixels disposed in a row direction, a signal line connected to the infrared detection pixels disposed in a column direction, a constant current source connected to the signal line, a row selection circuit connected to the row selection lines, a column amplifier connected to the signal line, a removing circuit connected to the column amplifier, and a reading circuit connected to an output of the column amplifier, the method comprises applying a voltage to the infrared detection pixels via the row selection line by using the row selection circuit, thereby generating a column voltage; generating an amplification voltage obtained by amplifying the column voltage in the column amplifier; removing a bias component, which is generated by a bias current flowing through the column amplifier, from the amplification voltage by using the removing circuit; and outputting the output voltage, which is obtained by removing the bias component from the amplification voltage, from the column amplifier to the reading circuit.

An infrared camera according to an embodiment of the present invention comprises an imaging area disposed on a semiconductor substrate and including a plurality of infrared detection pixels which detect infrared rays; row selection lines connected to the infrared detection pixels disposed in a row direction; a signal line connected to the infrared detection pixels disposed in a column direction; a constant current source connected to the signal line; a row selection circuit applying a voltage to the infrared detection pixels via the row selection line and generating a column voltage in the signal line; a column amplifier connected to the signal line, the column amplifier including a first amplifying transistor which generates an amplification voltage obtained by amplifying the column voltage and a first clamp circuit which holds threshold voltage information of the first amplifying transistor in a gate of the first amplifying transistor; a removing circuit including a second amplifying transistor which has conductivity opposite to that of the first amplifying transistor and a second clamp circuit which holds threshold voltage information of the second amplifying transistor in a gate of the second amplifying transistor, the removing circuit being connected to the column amplifier to remove a bias component generated by a bias current, which flows through the column amplifier, from the amplification voltage; and a reading circuit reading an output voltage from the column amplifier, the output voltage is obtained by excluding at least the bias component from the amplification voltage.

A driving method of an infrared camera according to an embodiment of the present invention, the infrared sensor comprising an imaging area disposed on a semiconductor substrate and including a plurality of infrared detection pixels which detect infrared rays, row selection lines connected to the infrared detection pixels disposed in a row direction, a signal line connected to the infrared detection pixels disposed in a column direction, a constant current source connected to the signal line, a row selection circuit connected to the row selection lines, a column amplifier connected to the signal line, a removing circuit connected to the column amplifier, and a reading circuit connected to an output of the column amplifier, the method comprises applying a voltage to the infrared detection pixels via the row selection line by using the row selection circuit, thereby generating a column voltage; generating an amplification voltage obtained by amplifying the column voltage in the column amplifier; removing a bias component, which is generated by a bias current flowing through the column amplifier, from the amplification voltage by using the removing circuit; outputting the output voltage, which is obtained by removing the bias component from the amplification voltage, from the column amplifier to the reading circuit; and reading the output voltage from the column amplifier in the reading circuit.

DETAILED DESCRIPTION OF THE INVENTION

Figure 1:
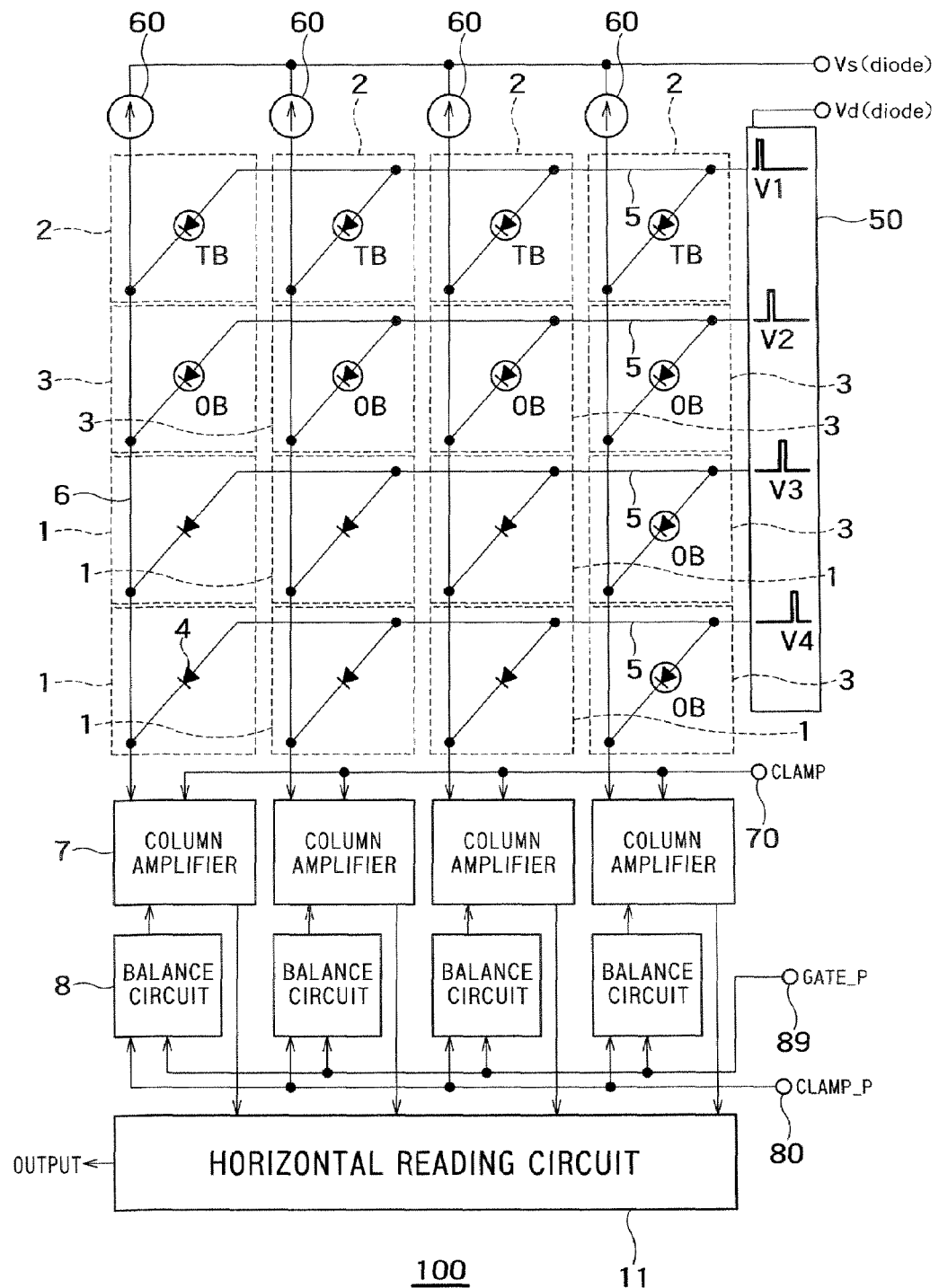
FIG. 1 is an explanatory diagram of an infrared sensor 100 according to a first embodiment.

An uncooled infrared sensor has a pn junction thermally isolated from a substrate disposed in each pixel. The infrared sensor passes a forward current to the pn junction, and reads a voltage corresponding to an operation point that changes due to a temperature of the pn junction. Thereby, the infrared sensor reads a signal.

A change of the temperature of a pixel unit in the imaging device is about $5\times10^{-3}$ of a temperature change of a photogenic subject in general, although this depends on an absorption rate of an infrared absorbing layer and an optical system. In other words, when the temperature of the subject changes by 1 K, a pixel temperature changes by 5 mK. When eight silicon pn junctions are connected in series, thermoelectric conversion efficiency is about 10 mV/K. Therefore, when the temperature of the subject changes by 1 K, a signal voltage of 50 µV is generated in the pixel unit. Actually, a temperature change of about 0.1 K of the subject is required to be identified in many cases. For this purpose, the infrared sensor needs to read a signal voltage of about 5 μV generated in the pixel unit.

As a circuit that reads a very weak signal voltage like this, a gate modulation integration circuit is known. This integration circuit amplifies current by using a signal voltage generated by a pixel unit as a gate voltage of an amplifying transistor, and temporally integrates current of the amplified signal by a storage capacitor. The integration circuit is disposed in each column, and a current amplification of one row is processed in parallel. In this way, a signal band can be limited and random noise can be decreased.

A voltage gain G in the integration circuit can be given as shown in the expression 1 by using mutual conductance gm (=δId/δVg) of the amplifying transistor, integration time ti, and storage capacitance Ci.

$$G=(ti \times gm)/Ci \qquad \text{(Expression 1)}$$

When the integration time ti and the storage capacitance Ci are given, the gain G depends on the mutual conductance gm of the amplifying transistor. When the n-type MOS transistor operates in the saturation region, gm is approximated as shown in the expression 2.

$$gm=(W/L) \cdot (\epsilon ox/Tox) \cdot \mu n \cdot (Vgs-Vth) \qquad \text{(Expression 2)}$$

In the above expression, W represents a channel width, L represents a channel length, εox represents a dielectric constant of a gate oxide film, Tox represents a gate oxide film thickness, μn represents electron mobility, Vgs represents a voltage between a gate and a source, and Vth represents a threshold voltage of a transistor.

A signal voltage level of about 5 μV generated in an output of the pixel is much lower than that of a CMOS image sensor imaging visible light. For example, conventionally, a noise voltage is about 400 μV. In other words, a noise level of the above infrared sensor is at a low voltage of about 1/80 of that of the CMOS image sensor. A signal voltage to be handled in the infrared sensor also becomes a low voltage of about 1/80 of that of the CMOS image sensor. Therefore, when the output of the uncooled infrared sensor is processed by a circuit similar to a general CMOS image sensor, a gain of about 80 times is desirable.

However, a gate voltage of the amplifying transistor in the gate modulation integration circuit includes a fluctuation voltage component larger than the pixel output. Therefore, actually, the gain of the uncooled infrared sensor is set low This fluctuation voltage component is attributable to a fluctuation of a threshold voltage of the amplifying transistor and a fluctuation of a threshold voltage of a load transistor used as a constant current source. These fluctuations are about 30 mV in general. This fluctuation component of the threshold voltage is amplified by the amplification readout circuit, like the image output signal given as a gate voltage of the amplifying transistor. Therefore, when the gain is set to about 80 times, a large fluctuation component of 2.4 V is generated in the storage capacitor. Because this threshold voltage fluctuation is intrinsic to each amplification MOS transistor and each load MOS transistor, the fluctuation is generated as a fixed pattern on the image. Accordingly, the threshold fluctuation can be removed by using the external circuit.

However, in order to correct the fluctuation of the threshold voltage, the fluctuation of the threshold voltage accounts for a large portion of the voltage swing of the storage capacitor, and the dynamic range required by the external circuit expands. Therefore, conventionally, in order to decrease the load of the external circuit, the gain of the amplification reading circuit has had to be sacrificed. Because the gain cannot be made sufficiently large, the influence of random noise such as current shot noise and 1/f noise in the amplification readout circuit cannot be decreased sufficiently.

Regarding this problem, JP-A 2002-300475 (KOKAI) discloses a configuration that a DC (Direct Current) is separated by a coupling capacitor between the signal line and the amplifying transistor gate, and a switch transistor is disposed between the gate and the drain of the amplifying transistor.

According to this configuration, a gate voltage of the amplifying transistor can be clamped to a voltage including all of threshold voltage information of the amplifying transistor, threshold voltage information of the load transistor, voltage distribution information of the row selection line, and chip temperature information. As a result, the fluctuation in the threshold voltage of the amplification MOS transistor, and the fluctuation in the threshold voltage of the load MOS transistor can be excluded. Thereby, the gain of the column amplifier increases. Furthermore, the occurrence of lateral direction shading can be suppressed, and a chip temperature can be compensated for.

As shown in the expression 2, the mutual conductance gm of the amplifying transistor, which affects the gain of the column amplifier, is proportional to (Vgs–Vth) in the same device configuration. Therefore, in order to adjust the gain of the column amplifier, it is effective to control the source potential of the amplifying transistor such that the source potential during the clamp operation is different from the source potential during the amplification operation, as described in the Patent document 2.

In other words, assume that Vsc represents the source voltage during the clamp operation, Vsa represents the source voltage during the amplification operation, and Vsig represents the signal component generated in the signal line. The amplifying transistor operates following an expression 3 in which (Vgs–Vth) in the expression 2 is replaced by (Vsig+Vsc–Vsa).

$$gm=(W/L) \cdot (\epsilon ox/Tox) \cdot \mu n \cdot (Vsig+Vsc-Vsa) \qquad \text{(Expression 3)}$$

In this case, Vsig represents a very weak voltage in the order of micro voltages as described above.

On the other hand, in order to improve the gain of the column amplifier, (Vsc–Vsa) is adjusted in the order of 0 to a few hundred millivolts. Therefore, a most part of the current integrated by the storage capacitor of the column amplifier is a bias current component generated by (Vsc–Vsa). A current component obtained by amplifying Vsig is very small. In order to cope with this situation, generally, an external circuit removes a bias component that accounts for a most part of the voltage swing. With this arrangement, the imaging signal that accounts for only a small part of the voltage swing of the storage capacitor is amplified. As described above, the dynamic range of the column amplifier cannot be used sufficiently based on this method. Furthermore, the amplification operation cannot be carried out in a sufficiently high gain in order to prevent saturation attributable to the bias charge. As a result, noise cannot be decreased sufficiently.

Furthermore, the external circuit needs to remove a bias voltage and requires amplification. Therefore, a noise specification of the camera circuit becomes severe, and this hinders the cost reduction of the infrared camera and of an electronic device including the infrared camera.

The problems mentioned above are solved by embodiments of the present invention explained below with reference to the drawings. Note that the invention is not limited thereto.

FIRST EMBODIMENT

An infrared sensor 100 shown in FIG. 1 has an imaging area including 16 pixels that are arranged in four rows and four columns on a semiconductor substrate. In actual practice, the imaging area usually has more pixels, but 16 pixels are assumed here for the sake of convenience.

Thermal non-sensitivity pixels (hereinafter, also TB (Thermal Black) pixels) 2 are arranged in a first row of the imaging area. Optical non-sensitivity pixels (hereinafter, also OB (Optical Black) pixels) 3 are arranged in a second row of the imaging area. Three-column valid pixels 1 and one-column OB pixel 3 are arranged in a third row and a fourth row of the imaging area, respectively. Each pixel includes a pn junction 4.

Row selection lines 5 are connected to pixels arranged in a row direction. Vertical signal lines (hereinafter also simply referred to as signal lines) 6 are connected to pixels arranged in a column direction. Each row selection line 5 is connected to one end (the anode side) of each pn junction 4, and each signal line 6 is connected to the other side (the cathode side) of each pn junction 4.

The row selection lines 5 are connected to a row selection circuit 50. The row selection circuit 50 applies a pulse voltage to a selected row selection line 5. Each signal line 6 is connected to a constant current source 60. When the row selection circuit 50 applies a pulse voltage to the pn junctions 4 of a selected row, the pn junctions 4 of the selected row are sequentially biased. Accordingly, a column voltage is generated in the signal lines 6. On the other hand, the pn junctions 4 of unselected rows are all inversely biased, and, therefore, the row selection lines 5 are separated from the signal lines 6.

A column amplifier 7 is provided corresponding to each signal line 6. Each column amplifier 7 has an input 70 receive a clump pulse and carries out the clamp operation based on the clamp pulse. The column amplifier 7 amplifies a signal transmitted from the signal line 6.

A balance circuit 8 as a removing circuit is provided corresponding to each column amplifier 7. Each balance circuit 8 has a configuration similar to that of the column amplifier 7, and has a control input 80 for a clamp operation. The balance circuit 8 has a control voltage input 89 for controlling the amplification operation point.

The column amplifiers 7 are connected to a horizontal reading circuit (hereinafter also simply referred to as a reading circuit) 11. The reading circuit 11 sequentially outputs signals amplified by the column amplifiers 7 to the outside of the infrared sensor 100.

A configuration of each pixel is explained next.

Figure 2:
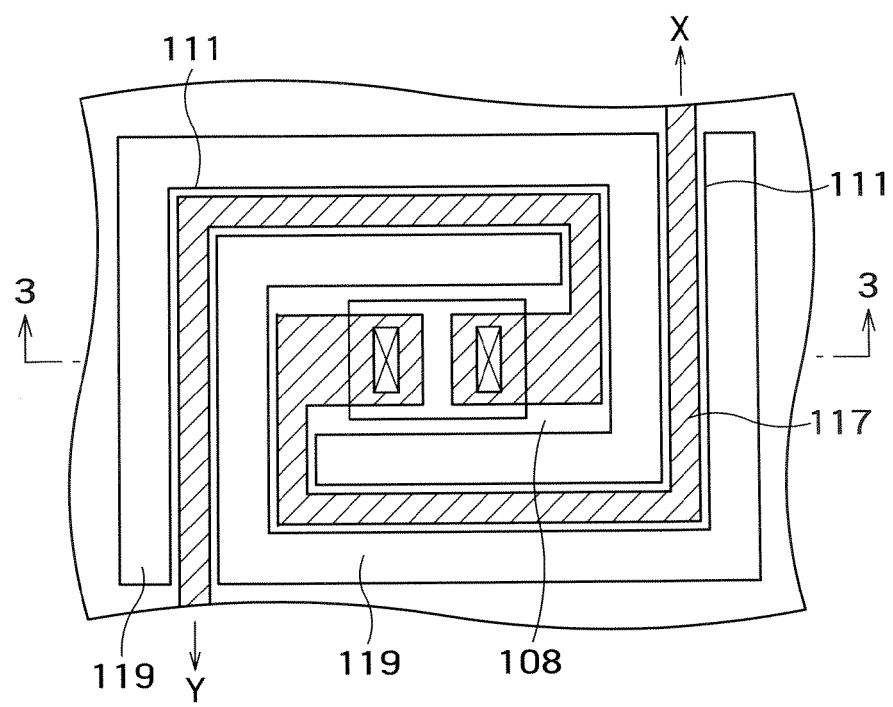
FIG. 2 is a top plan view of the valid pixel 1.
Figure 3:
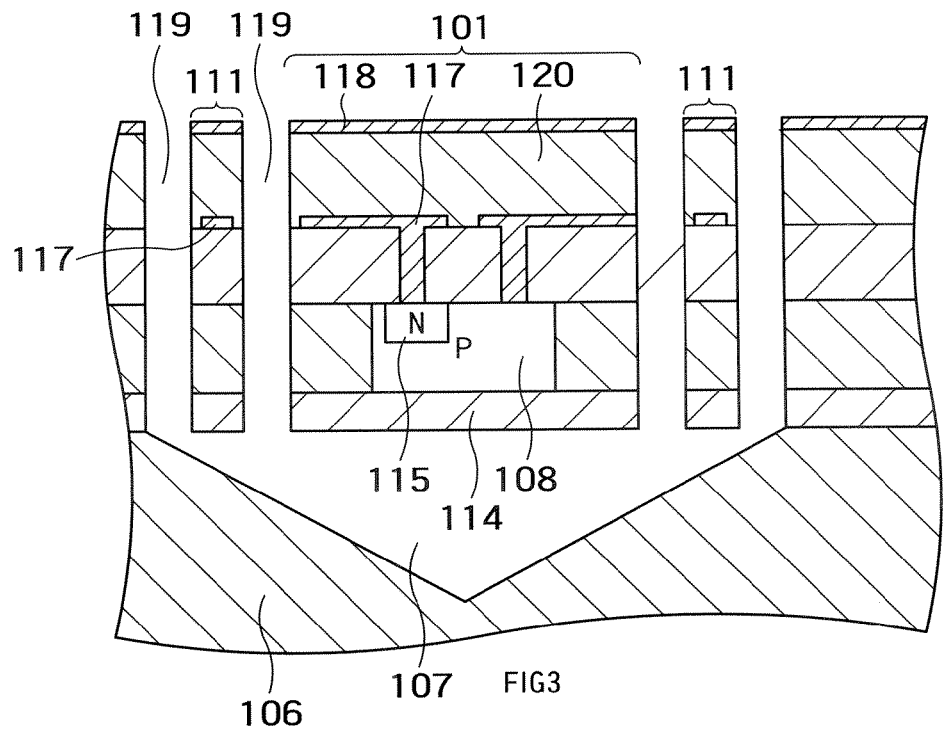
FIG. 3 is a cross-sectional diagram of the valid pixel 1.

FIG. 2 is a top plan view of the valid pixel 1. FIG. 3 is a cross-sectional diagram of the valid pixel 1 cut along a line 3-3 in FIG. 2. As shown in FIG. 3, the valid pixel 1 is supported on a cavity 107 provided above a semiconductor substrate 106. A BOX layer 114 is present above the cavity 107. A pn junction consisting of a p-type semiconductor 108 and an n-type semiconductor 115 is formed in a SOI layer on the BOX layer 114. An infrared ray incident from above the pixel in FIG. 3 is absorbed by absorption layers 118 and 120 at the surface portion, and becomes thermal energy. This thermal energy increases the temperature of a thermoelectric conversion unit 101 which includes the pn junction supported above the cavity.

Figure 4:
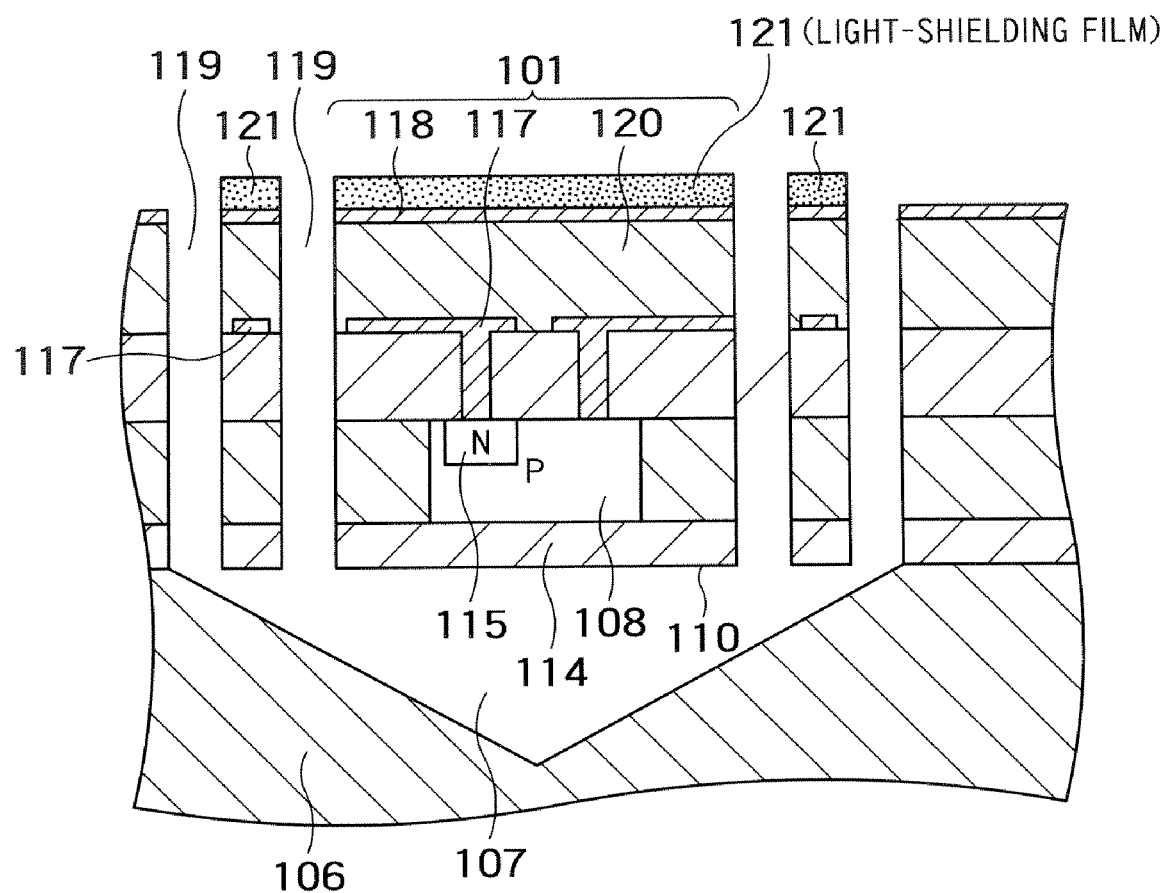
FIG. 4 is a cross-sectional diagram of the OB pixel 3.

FIG. 4 is a cross-sectional diagram of the OB pixel 3. A top plan view of the OB pixel 3 is similar to that shown in FIG. 2, and is therefore, omitted. Constituent elements that are the same as those shown in FIG. 3 are assigned with like reference numerals. The OB pixel 3 has a configuration having a light-shielding film 121 made of a metal layer, such as aluminum, provided on the surface of the valid pixel 1. Other elements of the OB pixel 3 can have the same configurations as those of the valid pixel 1. The OB pixel 3 has no infrared sensitivity because the OB pixel 3 does not absorb an incident infrared ray. However, in the OB pixel 3, self heating occurs as heating generated when a bias current is passed.

Figure 5:
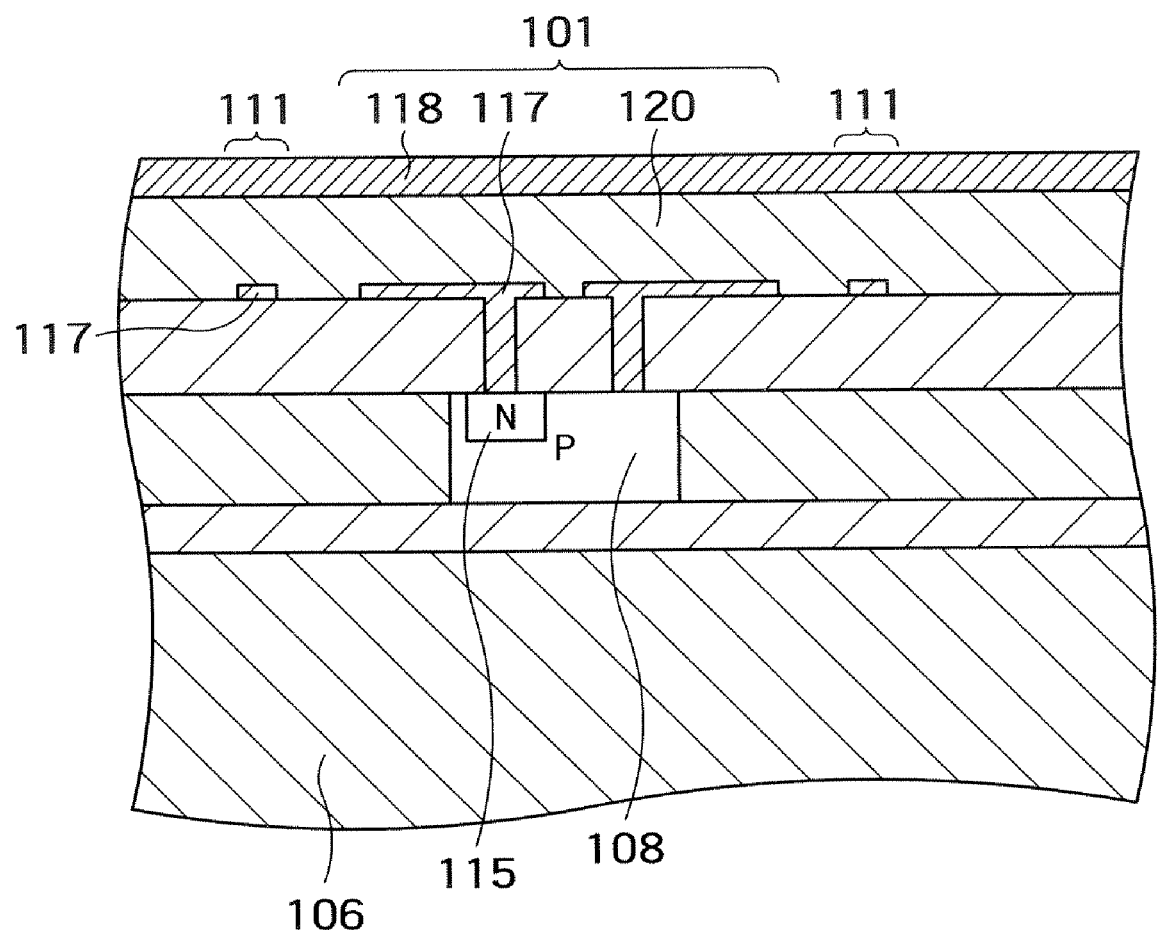
FIG. 5 is a cross-sectional diagram of the TB pixel 2.

FIG. 5 is a cross-sectional diagram of the TB pixel 2. A top plan view of the TB pixel 2 is similar to that shown in FIG. 2, and is therefore, omitted. Constituent elements that are the same as those in FIG. 3 are assigned with like reference numerals. The TB pixel 2 is different from the valid pixel 1 and the OB pixel 3 in that the TB pixel 2 does not have a thermal isolation structure made of the cavity 107 and an etching hole 119. The TB pixel 4 does not have sensitivity of an infrared ray. Joule heat generated when a bias current is passed is diffused to the substrate 106. Therefore, self heating does not occur.

A method of manufacturing the valid pixel 1 is briefly explained below. A pn junction consisting of the p-type semiconductor 108 and the n-type semiconductor 115 is formed in the SOI (Silicon On Insulator) layer of an SOI substrate. After wiring and others are formed, the etching hole 119 is formed in a passivation film to form the cavity 107. The silicon supporting substrate 106 is anisotropically etched via the etching hole 119 by wet etching using TMAH (tetramethylammonium hydroxide). As a result, the configuration as shown in FIG. 3 is obtained.

Figure 6:
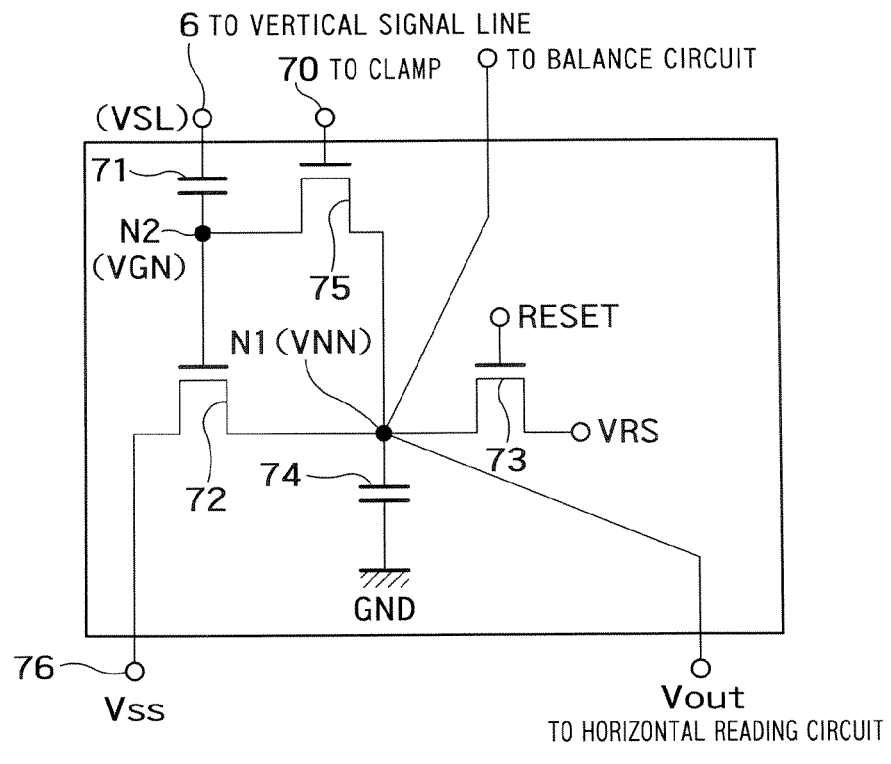
FIG. 6 is a circuit diagram of the column amplifier 7.

The column amplifier 7 shown in FIG. 6 includes a first amplifying transistor 72, a first node N1, a second node N2, a first coupling capacitance 71, a first clamp transistor 75, a first storage capacitor 74, and a reset transistor 73.

The first node N1 is connected to a drain of the first amplifying transistor 72. The second node N2 is connected to a gate of the first amplifying transistor 72. The first coupling capacitor 71 is connected to between the second node N2 and the signal line 6, and capacitance couples the gate of the first amplifying transistor 72 to the signal line 6. The first clamp transistor 75 is connected to between the first node N1 and the second node N2, and connects between the gate and the drain of the first amplifying transistor 72 during the clamp operation. With this arrangement, the first clamp transistor 75 holds the threshold voltage information of the first amplifying transistor 72 in the gate of the first amplifying transistor 72. The first storage capacitor 74 is connected to between the first node N1 and a reference voltage (the ground), and stores charge flowing through the first amplifying transistor 72. When the first amplifying transistor 72 is an N-type MOSFET, the charge stored in the first storage capacitor 74 is electron. A reset transistor 73 is connected to between the first node N1 and a reset potential VRS, and is turned on in the reset operation to set the potential of the first node N1 to a reset potential.

When the reset transistor 73 is turned on, the storage capacitor 74 is reset to the reset voltage VRS. After the reset transistor 73 becomes off, the first amplifying transistor 72 receives a column signal from the signal line 6 via the coupling capacitor 71. As a result, the first amplifying transistor 72 passes a charge, which is modulated based on the voltage VSL of the column signal, from the source to the drain (the first node N1). Accordingly, electron is stored in the first storage capacitor 74. In other words, an amplified signal obtained by amplifying the column signal is stored in the first storage capacitor 74. A potential corresponding to this storage charge appears as a potential VNN of the first node N1. The first node N1 is connected to the reading circuit 11. Therefore, the amplified signal stored in the first storage capacitor 74 is output to the reading circuit 11. As explained above, the column amplifier 7 is configured as a GMI (Gate Modulation Integration) circuit which inputs the column voltage VSL generated in the signal line 6.

The first amplifying transistor 72, the reset transistor 73, and the clamp transistor 75 are N-type MOSFETs, for example. A source voltage 76 of the first amplifying transistor 72 is Vss.

Figure 7:
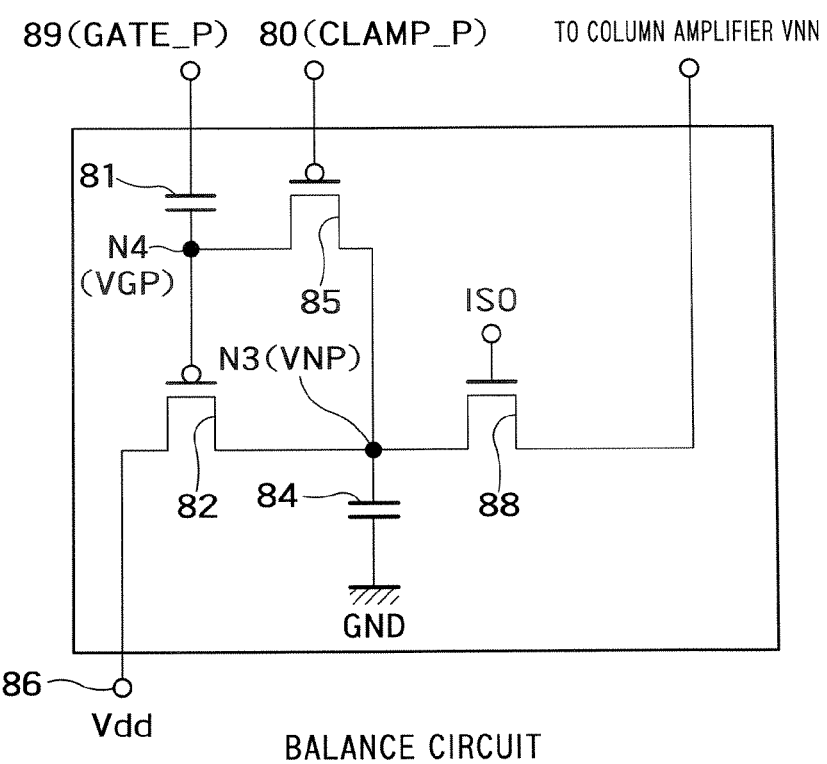
FIG. 7 is a circuit diagram of the balance circuit 8.

The balance circuit 9 shown in FIG. 7 includes a second amplifying transistor (also referred to as a balance transistor) 82, a third node N3, a fourth node N4, a second coupling capacitor 81, a second clamp transistor 85, a second storage capacitor 84, and an isolating transistor 88. The balance circuit 9 has a configuration similar to that of the column amplifier 7. However, the second amplifying transistor 82 and the second clamp transistor 85 are P-type MOSFETs. A source voltage 86 of the second amplifying transistor 82 is Vdd.

The third node N3 is connected to a drain of the second amplifying transistor 82. The fourth node N4 is connected to a gate of the second amplifying transistor 82. The second coupling capacitor 81 is connected to between the fourth node N4 and a control voltage input 89 which gives a control voltage to the gate of the second amplifying transistor 82. The second coupling capacitor 81 couples the gate of the second amplifying transistor 82 to the control voltage input 89. The second clamp transistor 85 is connected to between the third node N3 and the fourth node N4, and connects between the gate and the drain of the second amplifying transistor 82 during the clamp operation. With this arrangement, the second clamp transistor 85 stores the threshold voltage information of the second amplifying transistor 82 in the gate of the second amplification MOS transistor 82. However, a signal CLAMP_P, which is input to the gate of the second clamp transistor 85, is a pulse signal having a phase opposite to that of a signal CLAMP which is input to the gate of the first clamp transistor 75. The second storage capacitor 84 is connected to between the third node N3 and the reference voltage (the ground), and stores charge which flows through the second amplifying transistor 82. When the second amplifying transistor 82 is a P-type MOSFET, the charge stored in the second storage capacitor 84 is a hole charge. The isolating transistor 88 is connected to between the third node N3 and the first node N1. The isolating transistor 88 is in the on state during the reset operation and the amplification operation other than the clamp operation. In this case, the first storage capacitor 74 and the second storage capacitor 84 are conducted.

During the clamp operation, in order to separately clamp a gate potential VGN (a potential of the second node N2) and a gate potential VGP (a potential of the fourth node N4), the isolating transistor 88 needs to be in the off state. During the reset operation and the amplification operation other than the clamp operation, the isolating transistor 88 is in the on state. Therefore, the potential VNN of the first node N1 and the potential VNP of the third node N3 become equal during these periods.

The second amplifying transistor 82 receives a control voltage GATE_P from the control voltage input 89 via the coupling capacitor 81. Accordingly, the second amplifying transistor 82 passes a hole charge, which is modulated based on the control voltage GATE_P, from the source to the drain (the third node N3). The hole charge is stored in the second storage capacitor 84. Because the third node N3 and the first node N1 are connected to each other, the hole charge stored in the second storage capacitor 84 is coupled with the electron stored in the first storage capacitor 74, and disappears. In other words, the charge stored in the second storage capacitor 84 is used to offset the charge stored in the storage capacitor 74. After this offsetting, the potential (the first node potential VNN) remaining in the first storage capacitor 74 is output to the reading circuit 11 as a column output Vout.

When the voltage (Vdd−GATE_P) becomes equal to an output component of the column voltage VSL during a no signal period, a bias component of the charge stored in the first storage capacitor 74 is offset, and an infrared signal component Vsig remains in the first storage capacitor 74. Therefore, the amplification signal actually output to the reading circuit 11 can become the infrared signal component Vsig.

A source voltage Vss of the first amplifying transistor 72 is a ground voltage as a reference voltage, for example. The source voltage Vdd of the second amplifying transistor 82 is a second reference potential higher than Vss. Furthermore, a drain voltage of the reset transistor 73 is a reset voltage VRS. The reset voltage VRS has a relationship of Vss<VRS<Vdd. In this embodiment, it is assumed that Vss=0, and VRS=Vdd/2.

Figure 8:
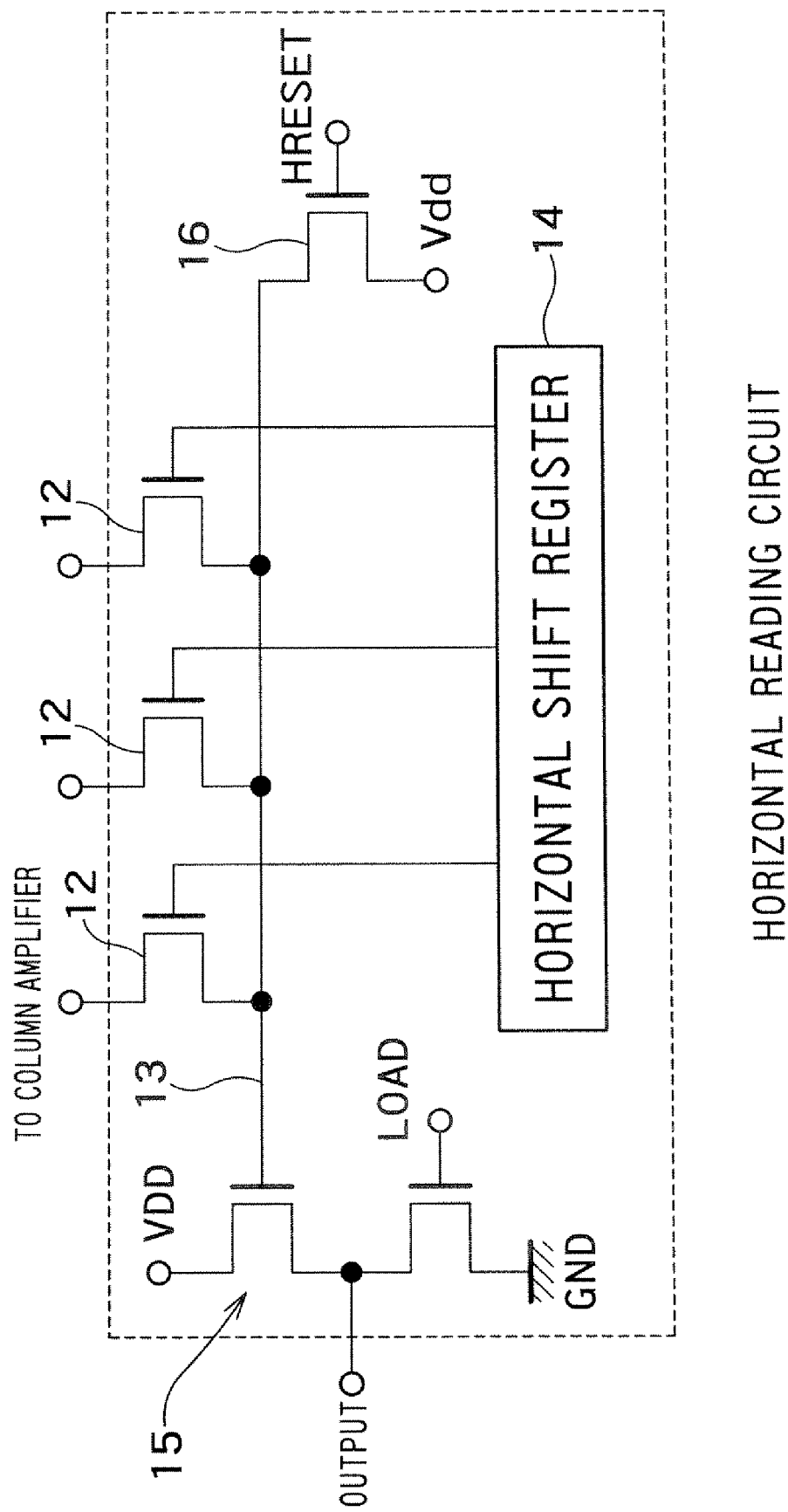
FIG. 8 is a circuit diagram of the reading circuit 11.

The reading circuit 11 shown in FIG. 8 includes horizontal selection circuits 12, a reading line 13, a horizontal shift register 14, a source follower circuit 15 as a buffer circuit, and a reset switch 16. Each horizontal selecting transistor 12 is connected to between the reading line 13 and each column amplifier 7. The horizontal shift register 14 is connected to a gate of the horizontal selecting transistor 12. The horizontal shift register 14 sequentially turns on the horizontal selecting transistors 12 to sequentially transmit output signals from the column amplifiers 7 to the reading line 13. The output signals are output to the outside of the infrared sensor 100 from the reading line 13 via a source follower circuit 15. A reset switch 16, and thereafter, resets the reading line 13 to Vdd. The source follower circuit 15 functions as a buffer circuit. Instead of the source follower circuit 15, an inverter amplifier circuit can be used for a buffer circuit.

Figure 9:
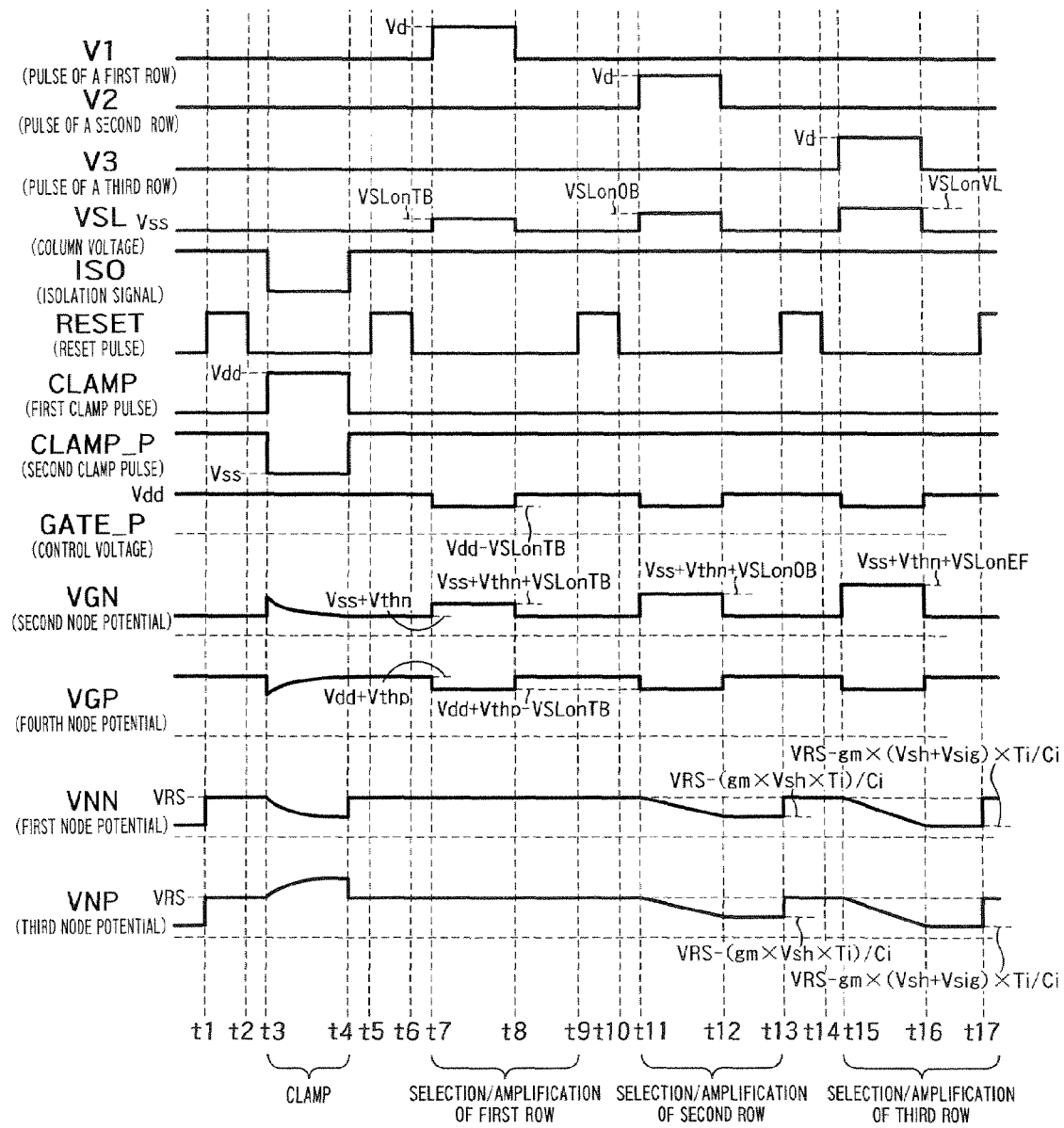
FIG. 9 is a timing chart showing the operation of the infrared sensor 100.

The infrared sensor 100 includes a clamp operation as shown in FIG. 9, a reset operation, and a selection/amplification operation. The reset operation and the amplification operation are a series of operations, and therefore, these operations can be integrally called an amplification operation. The reset operation and the clamp operation are also a series of operations, and therefore, these operations can be integrally called a clamp operation.

V1 to V3 are pulse voltages that are applied to the row selection lines from the first row to the third row. Each amplitude of the pulse voltages V1 to V3 is a voltage Vd that is supplied from the row selection circuit 50 to the row selection line 5. The row selection line 5 of the first row is selected during a period from time t7 to t8. The row selection line 5 of the second row is selected during a period from time t11 to t12. The row selection line 5 of the third row is selected during a period from time t15 to t16. The operation of a pixel string in the fourth row is the same as that of a pixel string in the third row, and therefore, the explanation of this operation is omitted.

VSL is a potential (column voltage) of the signal line 6. ISO is an isolation signal which is input to the gate of the isolating transistor 88. RESET is a reset pulse which is input to the gate of the reset transistor 73. CLAMP is a first clamp pulse which is input to the gate of the first clamp transistor 75. CLAMP_P is a second clamp pulse which is input to the gate of the second clamp transistor 85. GATE_P is a control voltage which is input to the gate of the second amplifying transistor 82. VNN, VGN, VNP, and VGP are potentials of the first node N1, the second node N2, the third node N3, and the fourth node N4, respectively. Therefore, VNN, VGN, VNP, and VGP are called a first node potential, a second node potential, a third node potential, and a fourth node potential, respectively.

During a period while the row selection line 5 is selected, a voltage obtained by subtracting a fall voltage Vpix in a pixel from the voltage Vd supplied to the row selection line 5 during the row selection period, i.e., (Vd−Vpix), is generated in the signal line 6. In other words, VSLon=Vd−Vpix. Vpix includes chip temperature information, self heating information, and variation information of a constant current source, of the infrared sensor 100, as well as information of the infrared rays incident to the imaging area. During the row non-selection period, the column voltage VSL is Vss.

As described above, while the isolating transistor 88 is in the off state during the clamp period from t3 to t4, the isolating transistor 88 is on during other periods. Therefore, during the period other than the clamp period, the first storage capacitor 74 and the second storage capacitor 84 are in the conductive state, and the first node N1 and the third node N3 are at the same potentials.

[Reset Operation]

Reset operation is the operation of resetting the first node potential VNN and the third node potential VNP to the reset voltage VRS, and is introduced before the clamp operation (during a period from t1 to t2) and before the amplification operation (during a period from t5 to t6), respectively. During a period from time t1 to t2, the reset voltage RESET is set to high, prior to the clamp operation. Accordingly, the reset transistor 73 becomes in the on state, and the first node potential VNN is reset to the reset voltage VRS. In this case, the isolating transistor 88 is also in the on state. Therefore, the third node potential VNP is also reset to the reset voltage VRS. This reset operation is also executed during the periods from t1 to t2, from t5 to t6, from t9 to t10, and from t13 to t14, respectively.

After the reset operation, the reset transistor 73 is set to off at time t2, and the isolating transistor 88 is also set to off at t3. As a result, the first storage capacitor 74 and the second storage capacitor 84 are mutually isolated.

[Clamp Operation]

Clamp operation is the operation of clamping the gate voltages of the first amplifying transistor 72 and the second amplifying transistor 82 (the second and the fourth node potentials VGN and VGP) at the voltage including the threshold voltage information of the first and the second amplifying transistors 72 and 82, respectively During a period from time t3 to t4, the first clamp pulse CLAMP is set to the high level Vdd, and the second clamp pulse CLAMP_P is set to the low level Vss. Furthermore, the control voltage GATE_P is set to the high level Vdd.

Accordingly, the clamp transistors 75 and 85 become in the on state, the gate and drain of the first amplifying transistor 72 are connected to each other, and the gate and the drain of the second amplifying transistor 82 are connected to each other. At this time, gate capacitances of the first and the second amplifying transistors 72 and 82 are sufficiently smaller than the first and the second storage capacitances 74 and 84, respectively. Accordingly, the gate voltages of the first amplifying transistor 72 and the second amplifying transistor 82 (the second and the fourth node potentials VGN and VGP) become the reset potential VRS same as the first and the third node potentials VNN and VNP.

The reset potential VRS has the relationship of Vss<VRS<Vdd as described above. The reset potential VRS is sufficiently enough to set the first and the second amplifying transistors 72 and 82 to the on state. In other words, when a threshold voltage of the first amplifying transistor 72 is Vthn and when a threshold voltage of the second amplifying transistor 82 is Vthp, a relationship of Vss+Vthn<VRS<Vdd+Vthp is obtained. Vthp is a negative voltage.

Accordingly, the first and the second amplifying transistors 72 and 82 becomes in the on state. Because the source voltage of the first amplifying transistor 72 is Vss, a drain current of the first amplifying transistor 72 flows in such a way as to bring the first node potential VNN close to Vss. Because the source voltage of the second amplifying transistor 82 is Vdd, a drain current of the second amplifying transistor 82 flows in such a way as to bring the third node potential VNP close to Vdd.

Thereafter, when VNN=VGN=Vss+Vthn, the first amplifying transistor 72 becomes off. When VNP=VGP=Vdd+Vthp, the second amplifying transistor 82 becomes off. At time t4, the first and the second clamp transistors 75 and 85 become in the off state. Accordingly, the second node potential VGN is maintained at Vss+Vthn, and the fourth node potential VGP is maintained at Vdd+Vthp. At the same time, the isolating transistor 88 is set to the on state Accordingly, the first storage capacitor 74 and the second storage capacitor 84 are set conductive.

When no row selection line 5 is selected (for example, during a period from t5 to t7), the gate voltage (the second node potential VGN) of the first amplifying transistor 72 maintains (Vss+Vthn), and the gate voltage (the fourth node potential VGP) of the second amplifying transistor 82 maintains (Vdd+Vthp). Therefore, (Vss+Vthn) is called a first clamp voltage, and (Vdd+Vthp) is called a second clamp voltage, for the sake of convenience.

Clamp operation is executed once during one frame period. One frame period is the period during which all row selection lines 5 are sequentially selected, and signal of all pixels within the imaging area are sequentially output.

[Selection/Amplification Operation of Pixels in the First Row]

After the reset operation during a period from t5 to t6, the row selection circuit 50 supplies a selection pulse V1 to the row selection line 5 of the first row during a period from t7 to t8. At this time, a TB pixel row shown in FIG. 1 is selected as a pixel in the first row. Therefore, the fall voltage Vpix after the pn junction 4 includes a bias voltage Vb based on the chip temperature and the bias current, but does not include the infrared signal component Vsig and the self heating component Vsh. In other words, Vpix=Vb. When the column voltage VSL of the signal line 6 in this case is VSLonTB, this becomes VSLonTB=Vd−Vpix=Vd−Vb.

The signal line 6 and the gate of the amplifying transistor 72 are coupled by the coupling capacitor 71. The coupling capacitor 71 is designed to be sufficiently larger than the gate capacitor of the first amplifying transistor 72. Therefore, when VSL changes from 0 to VSLonTB, the gate voltage (the second node potential VGN) of the first amplifying transistor 72 changes from the first clamp voltage (Vss+Vthn) to (Vss+Vthn+VSLonTB). Based on the change of the gate voltage, the first amplifying transistor 72 becomes in the on state, and a drain current flows. In other words, an electron current flows from the source of the first amplifying transistor 72 to the first node N1. As a result, the column voltage VSLonTB is amplified.

In the mean time, in synchronism with the pulse voltage V1, the control voltage GATE_P is changed from Vdd to (Vdd−VSLonTB). Accordingly, the gate voltage (the fourth node potential VGP) of the second amplifying transistor 82 changes from the second clamp voltage (Vdd+Vthp) to (Vdd+Vthp−VSLonTB). Based on the change of the gate voltage, the second amplifying transistor 82 becomes in the on state, and a hole current flows from the source of the second amplifying transistor 82 to the second node N2. As a result, the control voltage GATE_P is amplified.

It should be noted that the first storage capacitor 74 and the second storage capacitor 84 are connected via the isolating transistor 88. Furthermore, it should be noted that while the charge stored in the first storage capacitor 74 in the amplification by the first amplifying transistor 72 is electron, the charge stored in the second storage capacitor 84 in the amplification by the second amplifying transistor 82 is hole charge. Therefore, the electron stored in the first storage capacitor 74 and the hole charge stored in the second storage capacitor 84 are coupled together, and disappear. The electron stored in the first storage capacitor 74 and the hole charge stored in the second storage capacitor 84 are based on VSLonTB, and are substantially equal. As a result, as shown from time t7 to t8 in the graph in FIG. 9, the first node potential VNN and the third node potential VNP are balanced, and do not change from the reset voltage VRS (VRS=Vdd/2) The first node voltage VNN and the second node voltage VNP hold the voltage at the end of the amplification operation, that is, the reset voltage VRS. The reset voltage VRS held in the first node voltage VNN is read from the reading circuit 11. The read voltage becomes a reference voltage of the infrared sensor as a dark level.

When the selection and amplification operation of the pixels in the first row is finished at time t8, that is, when the pulse voltage V1 becomes low, the second node potential VGN returns to (Vss+Vthn). As a result, the first amplifying transistor 72 becomes off. In synchronism with the fall of the pulse voltage V1, the control voltage GATE_P returns from (Vdd−VSLonTB) to Vdd. Accordingly, the second amplifying transistor 82 becomes off.

[Selection/Amplification Operation of Pixels in the Second Row]

After the reset operation during a period from t9 to t10, the row selection circuit 50 supplies a selection pulse V2 to the row selection line 5 of the second row during a period from t11 to t12. The pixels of the second row include the OB pixels 3. Therefore, the fall voltage Vpix at the pn junction 4 includes the bias voltage Vb and the self heating component Vsh, but does not include the infrared signal component Vsig. In other words, Vpix=Vb−Vsh. When the column voltage VSL of the signal line 6 in this case is VSLonOB, this becomes VSLonOB=Vd−Vpix=Vd−(Vb−Vsh). The gate voltage (the second node potential VGN) of the first amplifying transistor 72 changes from the first clamp voltage (Vss+Vthn) to (Vss+Vthn+VSLonOB). The first amplifying transistor 72 amplifies the column voltage VSLonOB. As a result, the first storage capacitor 74 stores electron based on the column voltage VSLonOB.

In the mean time, (Vdd−VSLonTB) is applied to the gate of the second amplifying transistor 82 as the control voltage GATE_P, like the first row selection and amplification operation. In other words, the gate voltage (the fourth node potential VGP) of the second amplifying transistor 82 changes from the second clamp voltage (Vdd+Vthp) to (Vdd+Vthp−VSLonTB). As a result, the second storage capacitor 84 stores hole charge based on the voltage VSLonTB.

It should be noted that the electron stored in the first storage capacitor 74 is based on VGN=VSLonOB=Vd−(Vb−Vsh), and that the hole charge stored in the second storage capacitor 84 is based on VGP=Vd−Vb. Electron based on the self heat component Vsh is not coupled with the hole charge from the second storage capacitor 84, and remains in the first storage capacitor 74.

More specifically, the expression 4 and the expression 5 are established.

$$Vout = VRS - (gm \times Vsh \times Ti)/Ci \quad \text{(Expression 4)}$$

$$Qsig = gm \times Vsh \times Ti \quad \text{(Expression 5)}$$

Qsig represents a charge stored in the first storage capacitor 74 based on the self heating Vsh, and gm in the Expression 5 represents conductance of the first amplifying transistor 72. An amplification factor of the first amplifying transistor 72 is determined by gm. Ti represents a row selection period. Ci represents total capacitance of the first storage capacitor 74 and the second storage capacitor 84.

In general, mutual conductance is given by the expression 6.

$$gm = (W/L) \cdot (\epsilon ox/Tox) \cdot \mu \cdot (Vgs - Vth) \quad \text{(Expression 6)}$$

Mutual conductance of an NMOS is obtained by substituting μ with electron mobility μn. Mutual conductance of an PMOS is obtained by substituting μ with hole mobility μp. The electron mobility of the N-type MOSFET is different from the hole mobility μp of the P-type MOSFET. In order to make the mutual conductance (current drive capacity) of the first amplifying transistor 72 made of the N-type MOSFET equal to the mutual conductance (current drive capacity) of the second amplifying transistor 82 made of the P-type MOSFET, it is desirable to design each channel size (W/L) of the first amplifying transistor 72 and the second amplifying transistor 82.

When (W/L)×μ of the first amplifying transistor 72 is different from that of the second amplifying transistor 82, the electron current of the first amplifying transistor 72 and the hole current of the second amplifying transistor 82 can be balanced by suitably adjusting (Vgs−Vth). Specifically, by adjusting the control voltage GATE_P during the amplification operation, gm can be adjusted When the pulse voltage V2 becomes low at t12, the gate voltage (the second node potential VGN) of the first amplifying transistor 72 returns to the first clamp voltage. Therefore, the first amplifying transistor 72 becomes off. At the same time, the control voltage GATE_P returns to Vdd, and the gate voltage (the fourth node potential VGP) of the second amplifying transistor 82 returns to the second clamp voltage. Therefore, the second amplifying transistor 82 becomes off. The first node potential VNN and the third node potential VNP are held at VRS−(gm×Vsh×Ti)/Ci. The reading circuit 11 reads the first node potential VNN.

As explained above, in the selection/amplification operation of the second row, the potential Vout obtained by amplifying the self heating component Vsh appears as the first node potential VNN, and this potential is output.

Because the output Vout is the output of only the self heating component in pixels, this output Vout can be used as a reference voltage of the infrared sensor.

[Selection/Amplification Operation of Pixels in the Third Row]

After the reset operation during a period from t13 to t14, the row selection circuit 50 supplies a selection pulse V4 to the row selection line 5 of the third row during a period from t15 to t16. The pixels of the third row include the valid pixel 1. Therefore, the fall voltage Vpix after the pn junction 4 includes the bias voltage Vb, the self heating component Vsh, and the infrared signal component Vsig. In other words, Vpix=Vb−Vsh−Vsig. When the column voltage VSL of the signal line 6 during the selection of the valid pixel row is VSLonVL, this becomes VSLonVL=Vd−Vpix=Vd−(Vb−Vsh−Vsig). The gate voltage (the second node potential VGN) of the first amplifying transistor 72 changes from the first clamp voltage (Vss+Vthn) to (Vss+Vthn+VSLonVL). The first amplifying transistor 72 amplifies the column voltage VSLonVL. As a result, the first storage capacitor 74 stores electron based on the column voltage VSLonVL.

In the mean time, (Vdd−VSLonTB) is applied to the gate of the second amplifying transistor 82 as the control voltage GATE_P, like the first row selection and amplification operation. In other words, the gate voltage (the fourth node potential VGP) of the second amplifying transistor 82 changes from the second clamp voltage (Vdd+Vthp) to (Vdd+Vthp−VSLonTB). The second amplifying transistor 82 amplifies the voltage VSLonTB. As a result, the second storage capacitor 84 stores hole charge based on the voltage VSLonTB.

It should be noted that the electron stored in the first storage capacitor 74 is based on VGN=VSLonVL=Vdd−(Vb−Vsh−Vsig), and that the hole charge stored in the second storage capacitor 84 is based on VGP=VSLonTB=Vdd−Vb. Electron based on the self heat component Vsh and the infrared signal component Vsig is not coupled with the hole charge from the second storage capacitor 84, and remains in the first storage capacitor 74.

More specifically, the expression 7 and the expression 8 are established.

$$Vout=VRS-(gm\times(Vsh+Vsig)\times Ti)/Ci \quad \text{(Expression 7)}$$

$$Qsig=gm\times(Vsh+Vsig)\times Ti \quad \text{(Expression 8)}$$

When the pulse voltage V3 becomes low at t16, the gate voltage (the second node potential VGN) of the first amplifying transistor 72 returns to the first clamp voltage. Therefore, the first amplifying transistor 72 becomes off. At the same time, the control voltage GATE_P returns to Vdd, and the gate voltage (the fourth node potential VGP) of the second amplifying transistor 82 returns to the second clamp voltage. Therefore, the second amplifying transistor 82 becomes off. The first node potential VNN and the third node potential VNP are held at VRS−(gm×(Vsh+Vsig)×Ti)/Ci. The reading circuit 11 reads the first node potential VNN.

As explained above, in the selection and amplification operation of the third row, the potential Vout based on the self heating component Vsh and the infrared signal component Vsig appears as the first node potential VNN, and this potential is output.

In order to obtain a practical amplification factor, VSLonTB needs to be set to a few hundred millivolts. This value is much larger than Vsh or Vsig. Accordingly, conventionally, a bias component, which is generated by the column voltage VSLonTB irrelevant to the infrared signal, accounts for a large part of the voltage swing of the first storage capacitor 74. Therefore, it has been necessary to remove the bias component at the outside of the infrared sensor, such as a camera circuit, and amplify again a small signal voltage.

On the other hand, according to this embodiment, among the voltage swings of the first storage capacitor 74 and the second storage capacitor 84, the bias component irrelevant to the infrared signal is offset by the hole current from the second amplifying transistor 82. Therefore, the infrared sensor 100 can use a large part of the voltage swings of the first storage capacitor 74 and the second storage capacitor 84 for the infrared signal component. Accordingly, the infrared signal component can be amplified in a large gain. As a result, the infrared sensor 100 can have a high-sensitivity wide dynamic range strong against noise of a circuit at a latter stage of the column amplifier 7.

Furthermore, the infrared camera (not shown) having the infrared sensor 100 according to this embodiment can have a relaxed specification of noise, and therefore, can be produced at a low cost.

SECOND EMBODIMENT

In the first embodiment, the source 76 of the first amplifying transistor 72 has the constant voltage Vss, and the source 86 of the second amplifying transistor 82 has the constant voltage Vdd. Therefore, the conductance of the first amplifying transistor 72 that determines the gain of the column amplifier 8 is adjusted by VSLonTB.

In a second embodiment of the present invention, a pulse voltage is given to the source 76 of the first amplifying transistor 72 and the source 86 of the second amplifying transistor 82, respectively. Vsc is applied to the source 76 of the first amplifying transistor 72 during the clamp operation, and Vsa is applied to this source 76 during the selection and amplification operation. Vdc is applied to the source 86 of the second amplifying transistor 82 during the clamp operation, and Vda is applied to this source 86 during the selection and amplification operation.

In this case, the mutual conductance of the first amplifying transistor 72 is given by the expression 9, and the mutual conductance of the second amplifying transistor 82 is given by the expression 10.

$$gm \approx (W/L)\cdot(\epsilon ox/Tox)\cdot \mu n \cdot (VSLonTB+Vsa-Vsc) \quad \text{(Expression 9)}$$

$$gm \approx (W/L)\cdot(\epsilon ox/Tox)\cdot \mu p \cdot (VSLonTB-Vda+Vdc) \quad \text{(Expression 10)}$$

Vsh+Vsig is much smaller than VSLonTB+Vsa−Vsc and VSLonTB−Vda+Vdc, and is omitted accordingly.

In the second embodiment, as shown in the expression 9, a gain of the column amplifier 7 can be adjusted by changing a source voltage difference (Vsa−Vsc) without changing the column voltage VSLonTB.

In this case, in order to offset the bias current component that flows through the first amplifying transistor 72, it is preferable to set the source voltage potential as (Vsc−Vsa)=(Vda−Vdc). For example, when Vsa=0, Vda=Vdd, and when Vsc and (Vdd−Vdc) are set to a few hundred millivolts, a desirable gain can be obtained, and the pixels can be optimized simultaneously.

In order to carry out the amplification operation of the amplifying transistor 72 and the injection operation of hole charge by the balance transistor 82 based on a proper column amplifier gain, it is preferable to satisfy a condition of |Vdc−Vsc|<|Vda−Vsa|.

According to the second embodiment, optimization of pixel characteristics and optimization of gain of the column amplifier can be carried out simultaneously and independently. Therefore, in the second embodiment, the gain of the column amplifier 7 can be freely set at an optional VSLonTB. Furthermore, the second embodiment can obtain effects similar to those obtained from the first embodiment.

THIRD EMBODIMENT

In the first and the second embodiments, clamp operation is carried out during the non-selection period before the selection/amplification operation period. In this case, information held in the gate (the second node N2) of the first amplifying transistor 72 by the clamp operation are only the threshold value Vthn of the first amplifying transistor 72 and the source voltage Vss or Vsc during the clamp operation.

Figure 10:
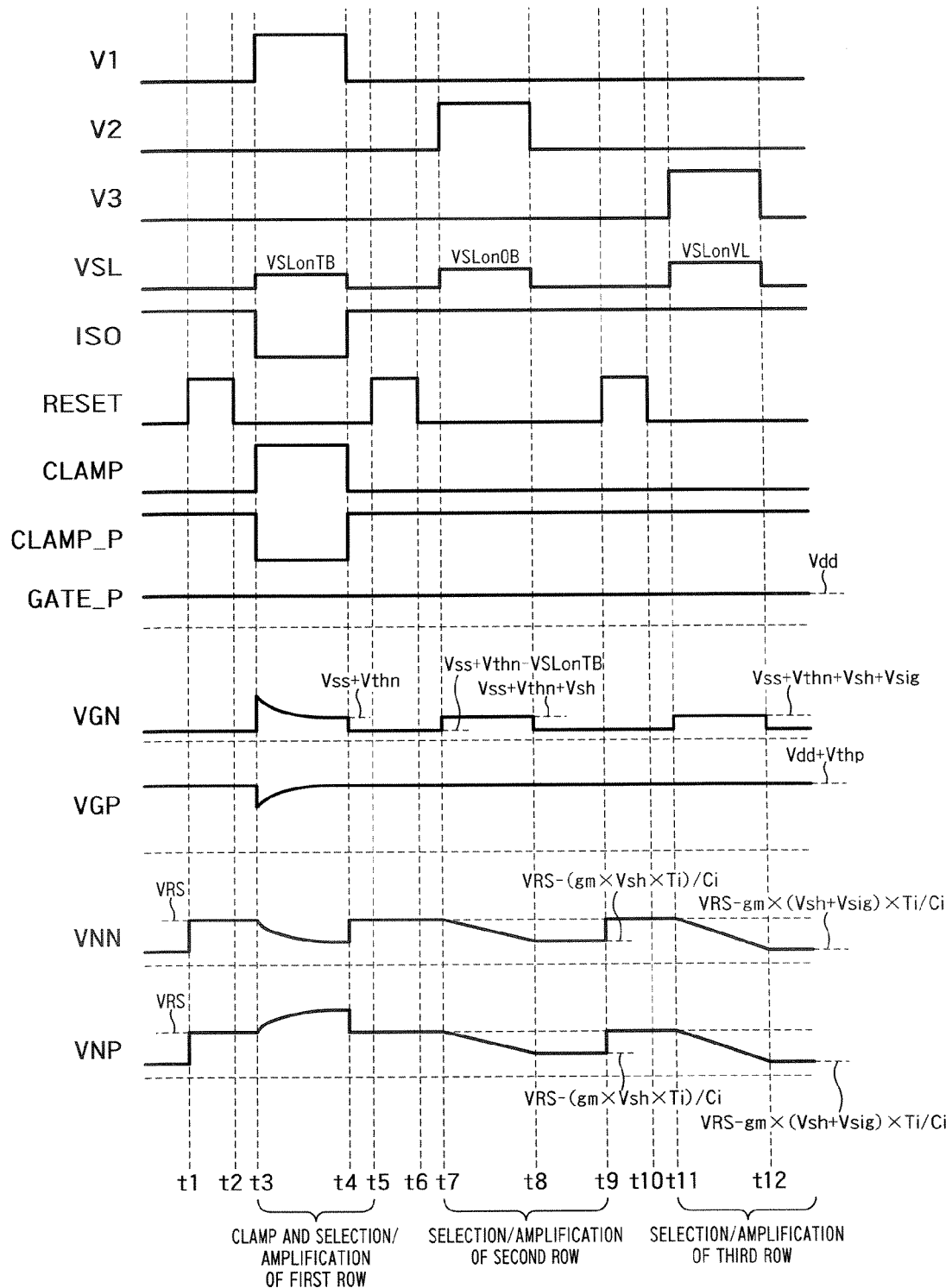
FIG. 10 is a timing chart showing the operation of the third embodiment.

In a third embodiment, the infrared sensor 100 shown in FIG. 1 is used to carry out the clamp operation during the selection of the TB pixel row. FIG. 10 is a timing chart showing the operation of the infrared sensor 100 according to the third embodiment. The control voltage GATE_P can be an optional DC voltage. Preferably, the control voltage GATE_P is about the same as the source voltage Vdd of the second amplifying transistor 82.

During a period from t1 to t2, the reset operation as explained in the first embodiment is carried out. During a period from t3 to t4, clamp operation is executed simultaneously with the selection/amplification operation of the first row. By the clamp operation, Vss+Vthn is transmitted to the gate (the second node N2) of the first amplifying transistor 72. Vdd+Vthp is transmitted to the gate (the fourth node N4) of the second amplifying transistor 82. At this time, the isolating transistor 88 is in the off state.

Furthermore, at the same time, the TB pixel row of the first row is selected at the pulse voltage V1. Accordingly, a column voltage VSLonTB=Vd−Vpix=Vd−Vb is transmitted to the gate (the second node N2) of the first amplifying transistor 72. Consequently, the clamp operation is finished at t4. When the isolating transistor 88 is turned on, the gate voltage (the second node potential VGN) of the first amplifying transistor 72 becomes Vss+Vthn−VSLonTB=Vss+Vthn−(Vd−Vb) as a first clamp voltage. In this case, the gate voltage (the fourth node potential VGP) of the second amplifying transistor 82 remains at Vdd+Vthp.

As described above, the first clamp voltage includes the chip temperature information Vb and the bias current information Vd, in addition to the source voltage information Vss and the threshold voltage information Vthn of the first amplifying transistor 72. As a result, in the subsequent selection and amplification operation, the gate voltage (the second node potential VGN) of the first amplifying transistor 72 does not include a column voltage component VSonTB, and includes only the self heating component Vsh and the infrared signal component Vsig. In other words, the first amplifying transistor 72 can amplify only the self heating component Vsh and the infrared signal component Vsig without amplifying the bias component.

For example, during the selection/amplification operation of the OB pixel row (during a period from t7 to t8), the control voltage GATE_P is constant at Vdd, but the gate voltage (the second node potential VGN) of the first amplifying transistor 72 becomes Vss+Vthn+Vsh. During the selection/amplification operation of the valid pixel row (during a period from t11 to t12), the gate voltage (the second node potential VGN) of the first amplifying transistor 72 becomes Vss+Vthn+Vsh+Vsig. As explained above, even when the control voltage GATE_P is constant, the bias component is excluded from the gate voltage (the second node potential VGN) of the first amplifying transistor 72. Other operations in the third embodiment are similar to those in the first embodiment, and therefore, their explanation is omitted.

According to this embodiment, ideally, no current flows through the second amplifying transistor 82 in the balance circuit. However, because the clamp operation is executed during a limited period, strictly speaking, a voltage clamped at VGP is lower than Vdd+Vthp, and a slight current flows. Similarly, strictly speaking, a voltage clamped at VGN is higher than Vss+Vthn, and a slight current flows through the column amplification circuit when VSL=VSLonTB. Therefore, this embodiment has effect that the balance circuit removes this slight current component.

In the third embodiment, the first clamp voltage includes the bias current component VSLonTB. Therefore, the occurrence of a vertical-string fixed pattern noise attributable to a variation in the constant current source 60 can be suppressed. Because chip temperature information is held, the infrared sensor according to the third embodiment is not easily affected by a variation in the chip temperature.

Information of a voltage distribution (so-called a shading effect) in a horizontal direction attributable to a voltage fall in the row selection line 5 is included in the column voltage VSLonTB. Therefore, the infrared sensor according to the third embodiment can suppress the shading effect. This shading effect becomes extreme when the bias current is increased to decrease noise in the image area. Accordingly, the bias current can be increased by suppressing the shading. This leads to decrease noise in the image area. Furthermore, the third embodiment can obtain effects similar to those obtained from the first embodiment.

FOURTH EMBODIMENT

A fourth embodiment of the present invention is a combination of the second embodiment and the third embodiment.

In other words, in the third embodiment, gain of the column amplifier is not practically sufficient. In the fourth embodiment, practical column amplifier gain can be realized.

In the third embodiment, the source 76 of the first amplifying transistor 72 is set to the constant voltage Vss, and the source 86 of the second amplifying transistor 82 is set to the constant voltage Vdd.

In the fourth embodiment, a pulse voltage is given to the source 76 of the first amplifying transistor 72 and the source 86 of the second amplifying transistor 82, respectively. Vsc is applied to the source 76 of the first amplifying transistor 72 during the clamp operation, and Vsa is applied to this source 76 during the selection/amplification operation. Vdc is applied to the source 86 of the second amplifying transistor 82 during the clamp operation, and Vda is applied to this source 86 during the selection/amplification operation.

In this case, the mutual conductance of the first amplifying transistor 72 is given by the expression 11, and the mutual conductance of the second amplifying transistor 82 is given by the expression 12.

$$gm \approx (W/L) \cdot (\epsilon ox/Tox) \cdot \mu n \cdot (Vsa-Vsc) \quad \text{(Expression 11)}$$

$$gm \approx (W/L) \cdot (\epsilon ox/Tox) \cdot \mu p \cdot (Vdc-Vda) \quad \text{(Expression 12)}$$

Because Vsh+Vsig is much smaller than (Vda−Vdc), this is omitted. In the fourth embodiment, VSLonTB is included in the first clamp voltage, like in the third embodiment. Therefore, the expression 11 and the expression 12 do not include VSLonTB.

The fourth embodiment can obtain both effects of the second and the third embodiments.

FIFTH EMBODIMENT

Figure 11:
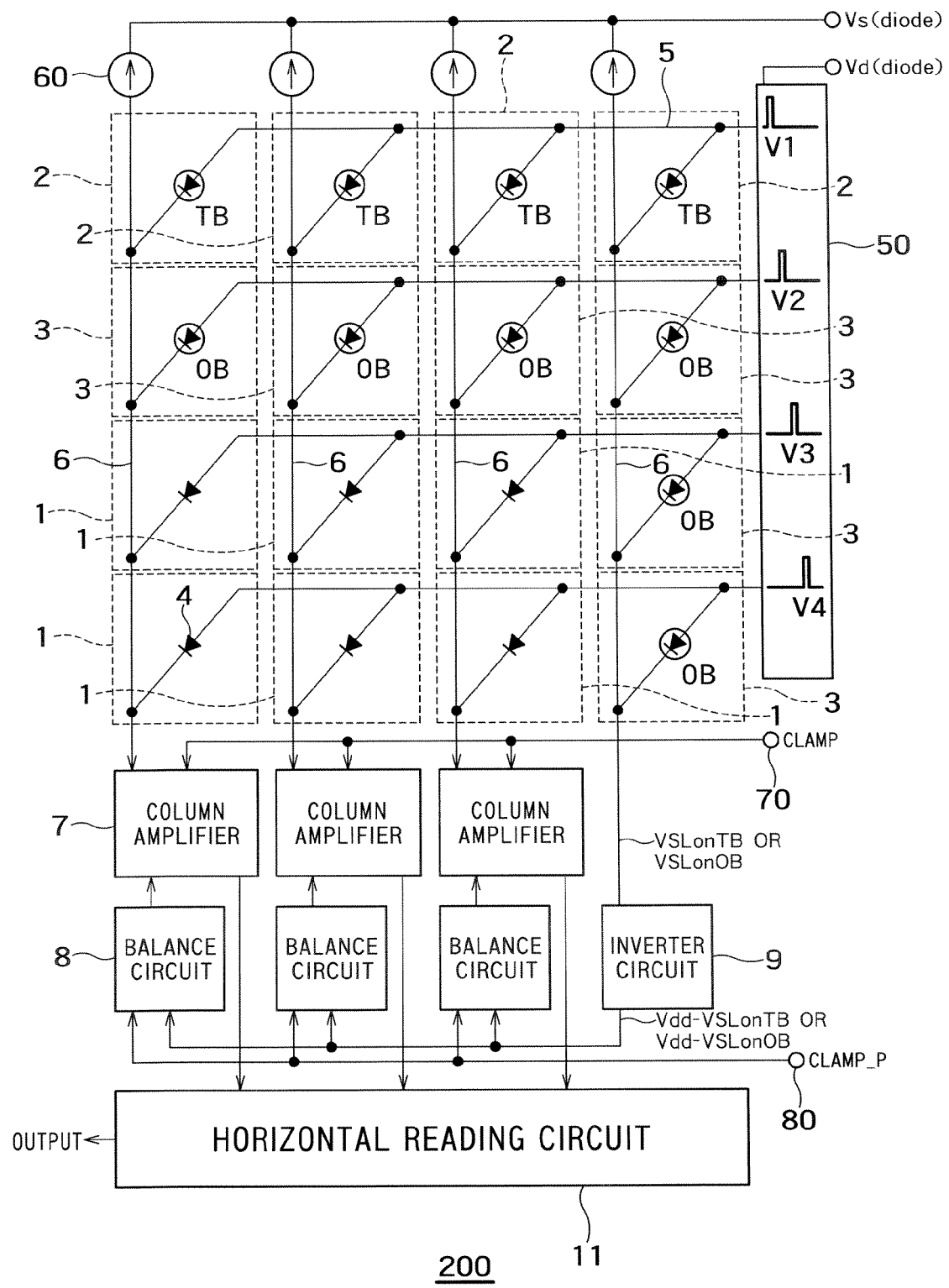
FIG. 11 is a diagram of an infrared sensor 200 according to a fifth embodiment.

FIG. 11 shows an infrared sensor 200 according to a fifth embodiment. In FIG. 11, constituent elements similar to those shown in FIG. 1 are assigned with like reference numerals. The fifth embodiment is different from the first embodiment in that the inverter circuit 9 generates the control signal GATE_P.

The inverter circuit 9 as a control voltage generator is connected to between the signal lines 6 of the TB and OB pixel strings and the balance circuit 8. The inverter circuit 9 can be an inverter amplification circuit using an operational amplifier or an inverter amplification circuit. The inverter circuit 9 inputs the column voltage VSLonTB or VSLonOB from the signal lines 6, and outputs Vdd−VSLonTB or Vdd−VSLonOB as a control voltage to the balance circuits 8.

Figure 12:
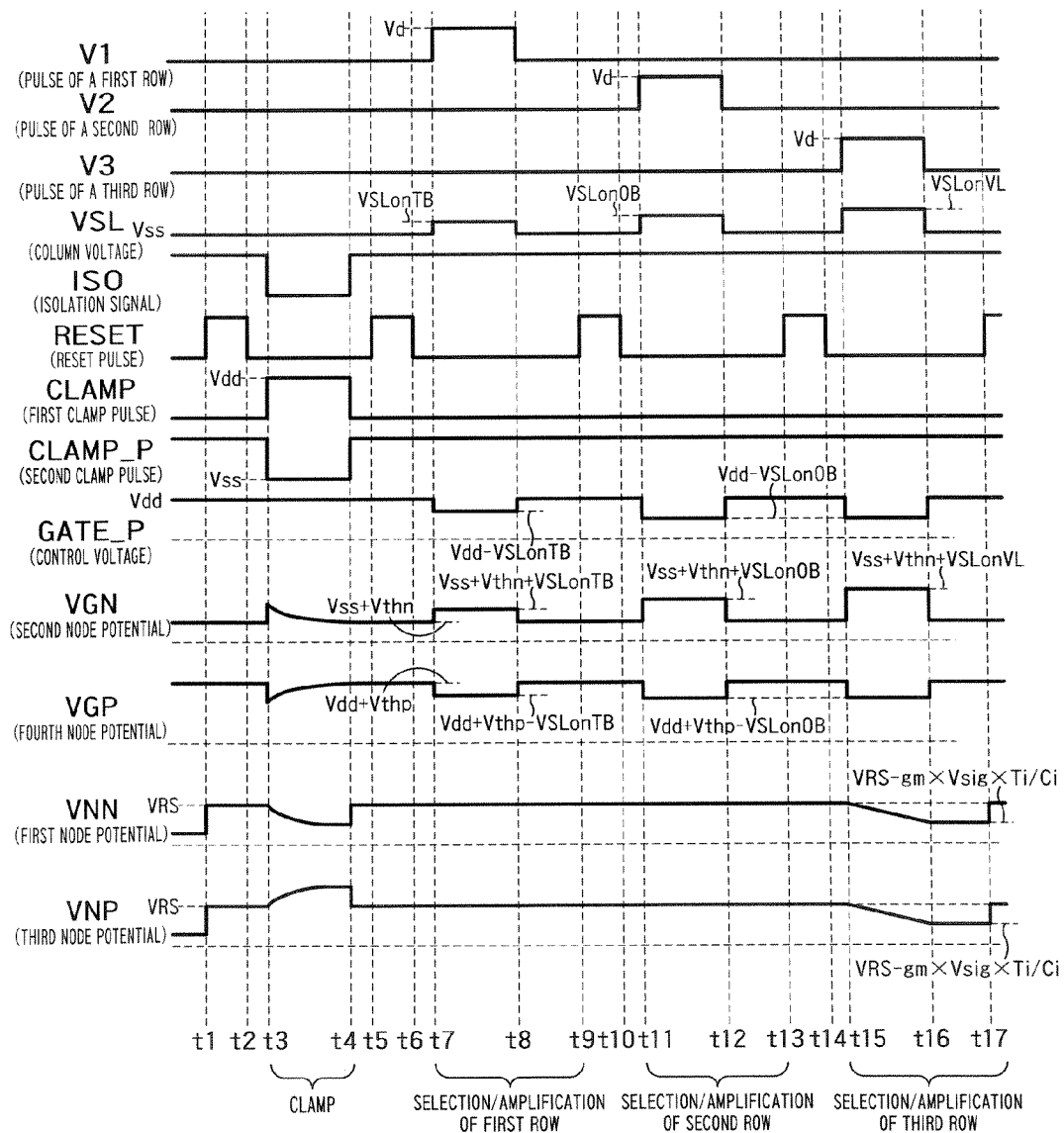
FIG. 12 is a timing chart showing the operation of the infrared sensor 200.

A basic operation of the infrared sensor 200 shown in FIG. 12 is similar to that of the first embodiment. However, the control voltage GATE_P is supplied as Vdd−VSLonOB from the inverter circuit 9.

During a period other than the selection/amplification operation, the potential of the signal lines of the TB and OB pixel strings is Vss=0. Therefore, the output of the inverter circuit 9 is Vdd.

After carrying out the reset operation (during a period from t1 to t2), the clamp operation (during a period from t3 to t4), and the reset operation (during a period from t5 to t6), the selection/amplification operation of the first row is executed during a period from t7 to t8. In this case, VSLonTB is generated in the signal lines 6 of the TB and OB pixel strings. The inverter circuit 9 outputs Vdd−VSLonTB to the balance circuits 8 as the control voltage GATE_P. Accordingly, the selection/amplification operation of the first row in the fifth embodiment becomes similar to that of the first embodiment.

After the reset operation during a period from t9 to t10, the OB pixel row of the second row is selected during a period from t11 to t12. In this case, VSLonOB=VSLonTB+Vsh is generated in the signal lines of the TB and OB pixel strings. Therefore, the inverter circuit 9 supplies (Vdd−VSLonTB−Vsh) to the balance circuits 8.

As a result, while the gate voltage (the fourth node potential VGP) of the second amplifying transistor 82 is Vdd+Vthp−VSLonTB in the first embodiment, this gate voltage becomes Vdd+Vthp−VSLonOB=Vdd+Vthp−VSLonTB−Vsh in the fifth embodiment. Accordingly, in the fifth embodiment, the second amplifying transistor 82 can supply a hole current to the column amplifier 7 to offset not only the bias component VSLonTB but also the self heating component.

Therefore, in the selection/amplification operation of the OB pixel row in the second embodiment (during a period from t11 to t13), the first node potential VNN, that is, Vout, is kept at VRS. In the selection/amplification operation of the valid pixel row of the third row (during a period from t15 to t17), the first node potential VNN, that is, Vout becomes a potential VRS−gm·Vig·Ti/Ci obtained by amplifying the infrared signal component Vsig.

The infrared sensor 200 can use substantially all the voltage swing of the first storage capacitor 74 for the infrared signal component, and can amplify the infrared signal component in large gain. Furthermore, the fifth embodiment can obtain effects similar to those obtained from the first embodiment.

SIXTH EMBODIMENT

A sixth embodiment of the present invention is a combination of the second embodiment and the fifth embodiment. In the fifth embodiment, the source 76 of the first amplifying transistor 72 is set to the constant voltage Vss, and the source 86 of the second amplifying transistor 82 is set to the constant voltage Vdd.

In the sixth embodiment, a pulse voltage is given to the source 76 of the first amplifying transistor 72 and the source 86 of the second amplifying transistor 82, respectively. Vsc is applied to the source 76 of the first amplifying transistor 72 during the clamp operation, and Vsa is applied to this transistor 72 during the selection and amplification operation. Vdc is applied to the source 86 of the second amplifying transistor 82 during the clamp operation, and Vda is applied to this transistor 82 during the selection and amplification operation.

In this case, the mutual conductance of the first amplifying transistor 72 is given by the expression 13, and the mutual conductance of the second amplifying transistor 82 is given by the expression 14.

$$gm \approx (W/L) \cdot (\epsilon ox/Tox) \cdot \mu n \cdot (VSLonTB+Vsa-Vsc) \quad \text{(Expression 13)}$$

$$gm \approx (W/L) \cdot (\epsilon ox/Tox) \cdot \mu p \cdot (VSLonTB+Vdc-Vda) \quad \text{(Expression 14)}$$

Vsh+Vsig is much smaller than VSLonTB, and is, therefore, omitted.

The sixth embodiment can obtain both effects of the second and the fifth embodiments.

SEVENTH EMBODIMENT

Figure 13:
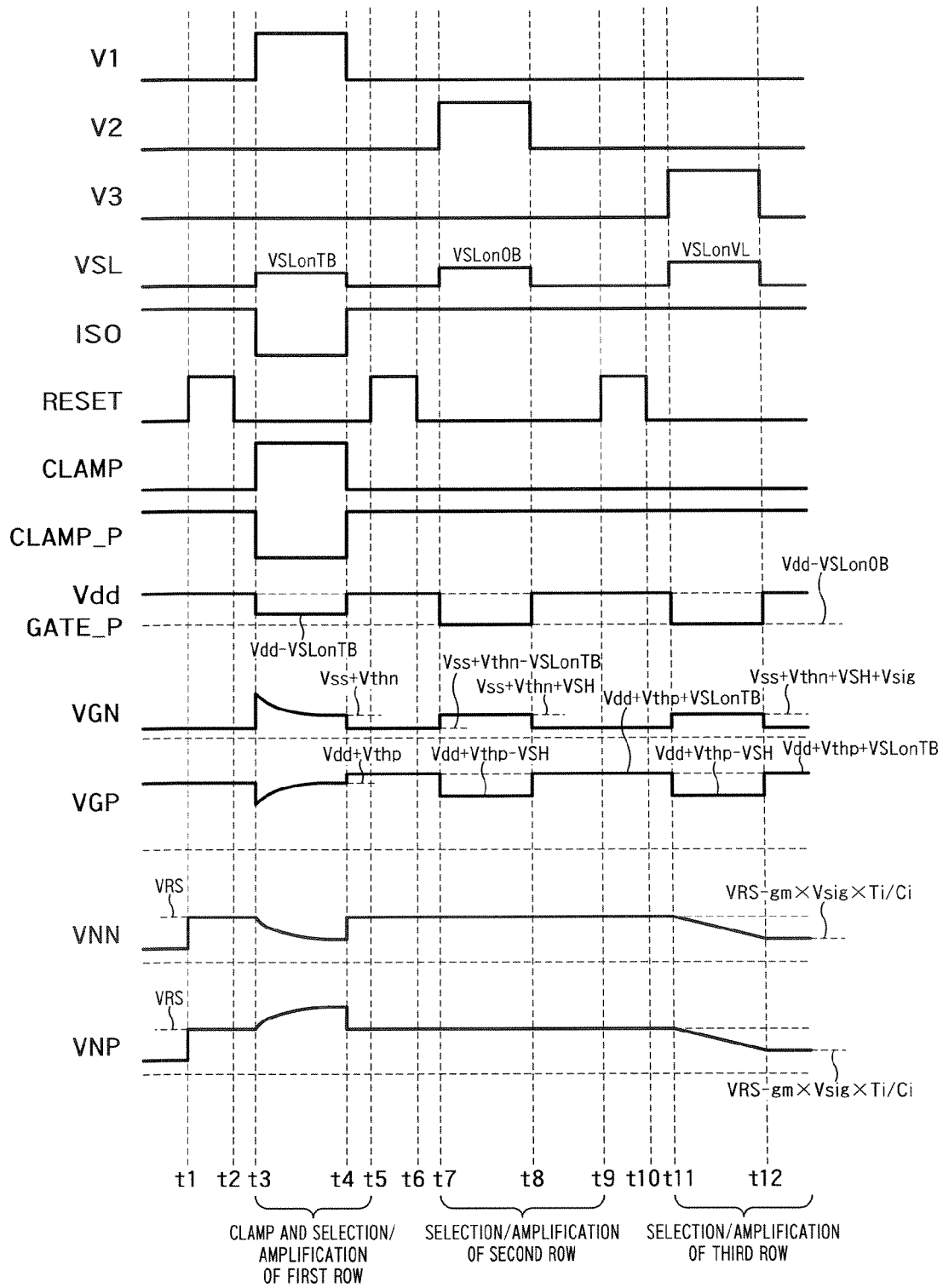
FIG. 13 is a timing chart showing the operation of a seventh embodiment.

The seventh embodiment shown in FIG. 13 is a combination of the third embodiment and the fifth embodiment, or a combination of the third embodiment and the sixth embodiment.

In the fifth and the sixth embodiments, clamp operation is executed during the non-selection period before the selection and amplification operation period. In this case, the information held in the gate (the second node N2) of the first amplifying transistor 72 by the clamp operation is only the threshold value Vthn of the first amplifying transistor 72 and the source voltage Vss or Vsc during the clamp operation.

In the seventh embodiment, the clamp operation and the selection of the TB pixel row are carried out simultaneously using the infrared sensor 200 shown in FIG. 11. The inverter circuit 9 supplies Vdd−VSLonTB to the balance circuit 8. During the row selection of the second and subsequent rows, the inverter circuit 9 supplies Vdd−VSLonOB to the balance circuit 8. Accordingly, at t4 and after, during the row selection (t4 to t7, t8 to t11, t12~) the gate voltage (the fourth anode potential VGP) of the second amplifying transistor 82 becomes Vdd+Vth+VSLonTB. VSLonTB is VSLonOB−Vsh. Therefore, the second amplifying transistor 82 can supply a hole current to the column amplifier 7 so as to offset the self heating component Vsh.

Therefore, during the selection/amplification operation of the OB pixel row of the second row (during a period from t7 to t9), the first node potential VNN, that is, Vout, is kept at the reset voltage VRS. During the selection/amplification operation of the valid pixel row of the third row (during a period from t11 to t12), the first node potential VNN, that is, Vout, becomes a potential VRS−gm·Vig·Ti/Ci obtained by subtract an amplified voltage of the infrared signal component Vsig from VRS. Other operations in the seventh embodiment are similar to those in the third embodiment.

The seventh embodiment can obtain both effects of the third and the fifth embodiments, or of the third and the sixth embodiments.

EIGTH EMBODIMENT

Figure 14:
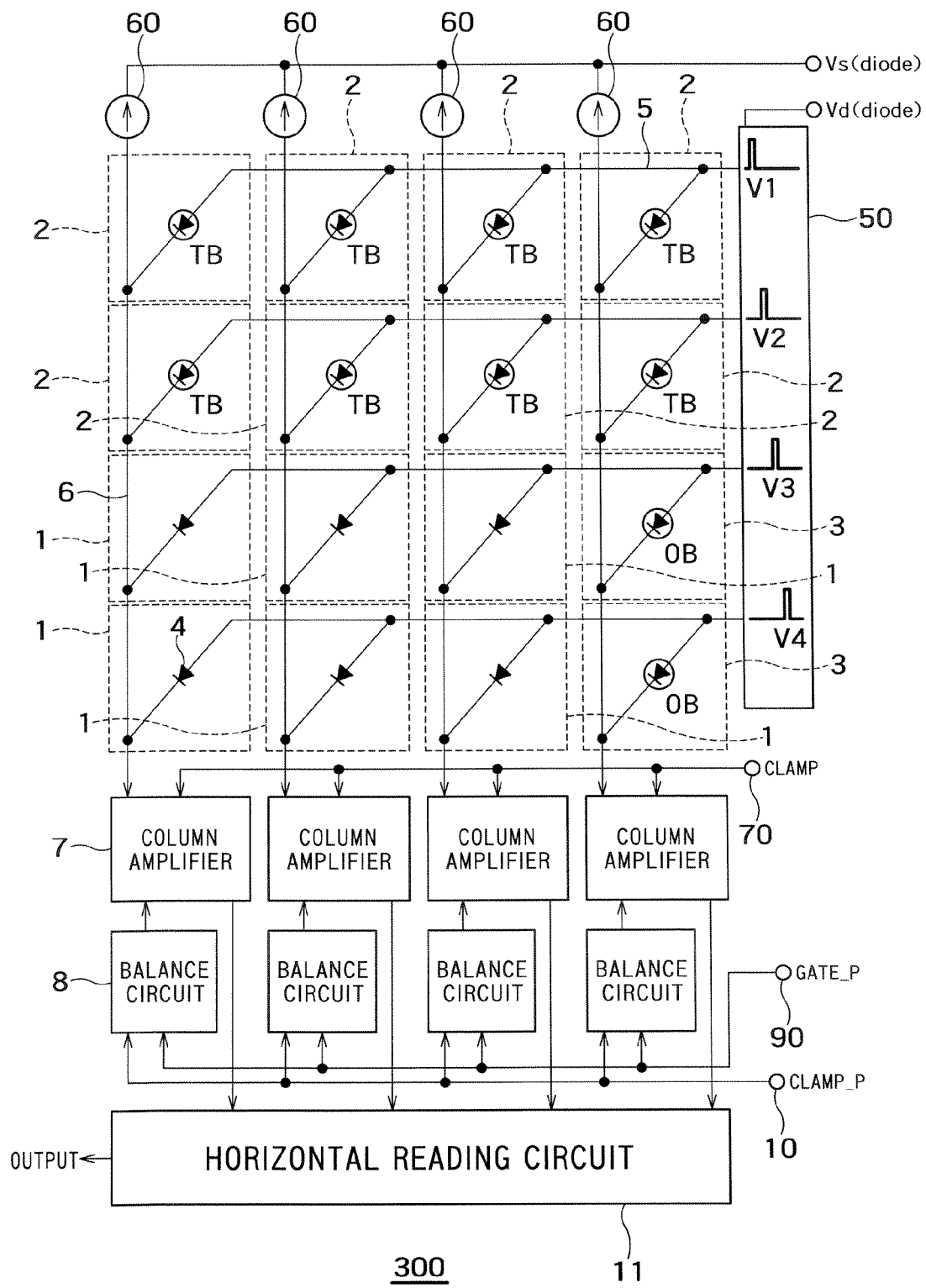
FIG. 14 is a diagram of an infrared sensor 300 according to an eighth embodiment.

The eighth embodiment shown in FIG. 14 is different from the first embodiment in that the TB pixels are disposed in the second row of the imaging area. The eighth embodiment is also different from the first embodiment in that the column amplifier 107 has a third clamp circuit CL3.

In the first to the seventh embodiments, during the reset operation, reset noise occurs in the first coupling capacitor 71 and the second coupling capacitor 81 at the time of turning off the clamp transistors 75 and 85, respectively. Because the reset noise occurs following the operation of turning off the clamp transistors 75 and 85, reset noise of in first coupling capacitor 71 and the second coupling capacitor 81 is constant during a certain frame period. By using this fact, an external circuit can remove the reset noise. The external circuit stores an output signal from the OB pixel row of the second row into the memory of one row, and subtracts this output signal from the output signal from the valid pixel rows in the third and subsequent rows. Therefore, the reset noise can be removed.

In the eighth embodiment, first node potential VNN (the column output Vout) during the selection and amplification operation of the TB pixel row is held during the frame period. By taking a difference between the column amplifier output obtained in the TB pixel row and the column amplifier output obtained in the sensitive pixel, the reset noise in the first coupling capacitor 71 and the second coupling capacitor 81 is removed within the infrared sensor 300.

Figure 15:
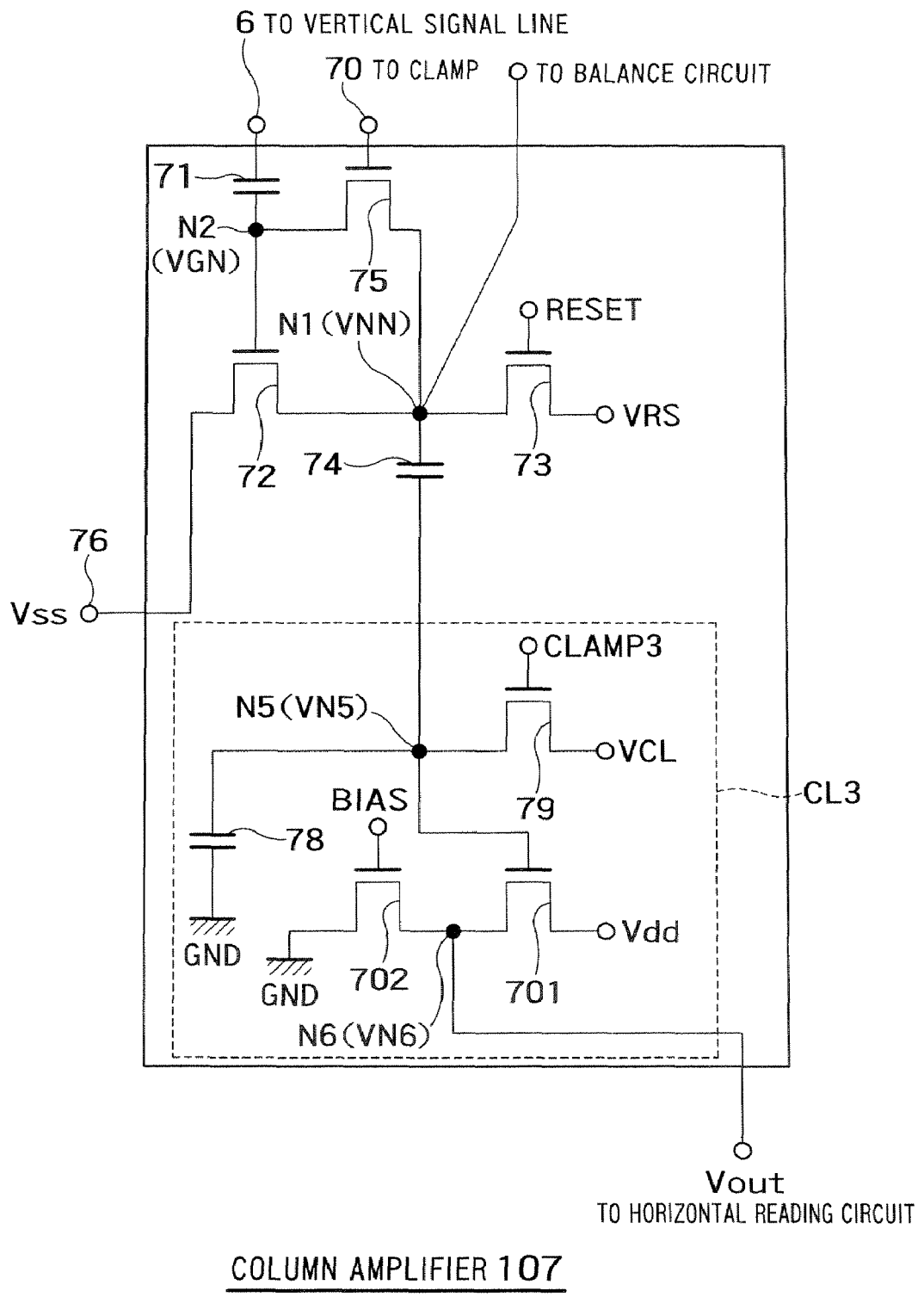
FIG. 15 is a circuit diagram showing the column amplifier 107.

The column amplifier 107 shown in FIG. 15 is different from the column amplifier 7 shown in FIG. 6 in that the column amplifier 107 includes the third clamp circuit CL3 connected to the first node N1 via the first storage capacitor 74. The third clamp circuit CL3 includes a fifth node N5, a sixth node N6, a third storage capacitor 78, a third clamp transistor 79, a driving transistor 701 constituting a source follower circuit as a buffer circuit, and a load transistor 702. The fifth node N5 is connected to one electrode of the first storage capacitor 74. The third storage capacitor 78 is connected to between the fifth node N5 and the ground. The third clamp transistor 79 is connected to between the fifth node N5 and a clamp voltage VCL. A gate of the driving transistor 701 is connected to the fifth node N5, and a drain of the driving transistor 701 is connected to Vdd. A source of the driving transistor 701 is connected to the sixth node N6. A gate of the load transistor 702 is connected to BIAS, a drain of the load transistor 702 is connected to the sixth node N6, and a source of the load transistor 702 is connected to the ground. The sixth node N6 is connected to the reading circuit 11. The driving transistor 701 and the load transistor 702 function as a source follower circuit, thereby buffering the column amplifier output Vout. The column amplifier output Vout changes according to a fifth node voltage VN5, and is output from the source follower circuit, which is constituted by the driving transistor 701 and the load transistor 702, to the reading circuit 11.

The source follower circuit as the column amplifier output buffer is constituted by the driving transistor 701 and the load transistor 702 as shown in FIG. 15. The fifth node potential VN5 is connected to the gate of the driving transistor 701. When the column amplifier output Vout can be read nondestructively, this buffer circuit does not need to be the source follower circuit.

Reset noise is determined by the capacitance of the coupling capacitor 71 and the chip temperature, and a reset noise voltage Vnr can be expressed as shown in the expression 15.

$$Vnr=(k \cdot T/C)^{1/2} \quad \text{(Expression 15)}$$

In the expression 15, k represents a Boltzmann constant, T represents a chip temperature, and C represents capacitance of the first coupling capacitor.

For example, when the coupling capacitor 71 has capacitance 10 pF, and when the chip temperature is a room temperature (T=300 K), the reset noise voltage Vnr is about 20 µV. This noise voltage Vnr is much smaller than a bias voltage of about a few hundred millivolts, a variation of the threshold voltage of about a few dozens of millivolts, and a self heating voltage of about a few millivolts. Therefore, a proportion of the noise voltage Vnr in the dynamic range of the column amplifier 107 is small. However, conventionally, in order to remove the noise voltage Vnr, a storage circuit and a difference processing circuit are necessary in the external circuit (such as a camera circuit) of the infrared sensor 300. Therefore, removal of the noise voltage Vnr is valid to decrease the cost of products having the infrared sensor 300.

Furthermore, this reset noise occurs depending on the capacitance of the coupling capacitor 81 during the clamp operation of the balance circuit 8. In this case, when the capacitance of the coupling capacitor 81 of the balance circuit 8 is Cp, the noise voltage Vpr (shown in the expression 15) can be similarly given by the expression 16.

$$Vpr=(k \cdot T/Cp)^{1/2} \quad \text{(Expression 16)}$$

Therefore, strictly speaking, $Vr=(Vnr^2+Vpr^2)^{1/2}$ needs to be considered as a total of the two types of reset noise.

The operation of the infrared sensor is explained below using Vr as a total of these two types of reset noise.

Figure 16:
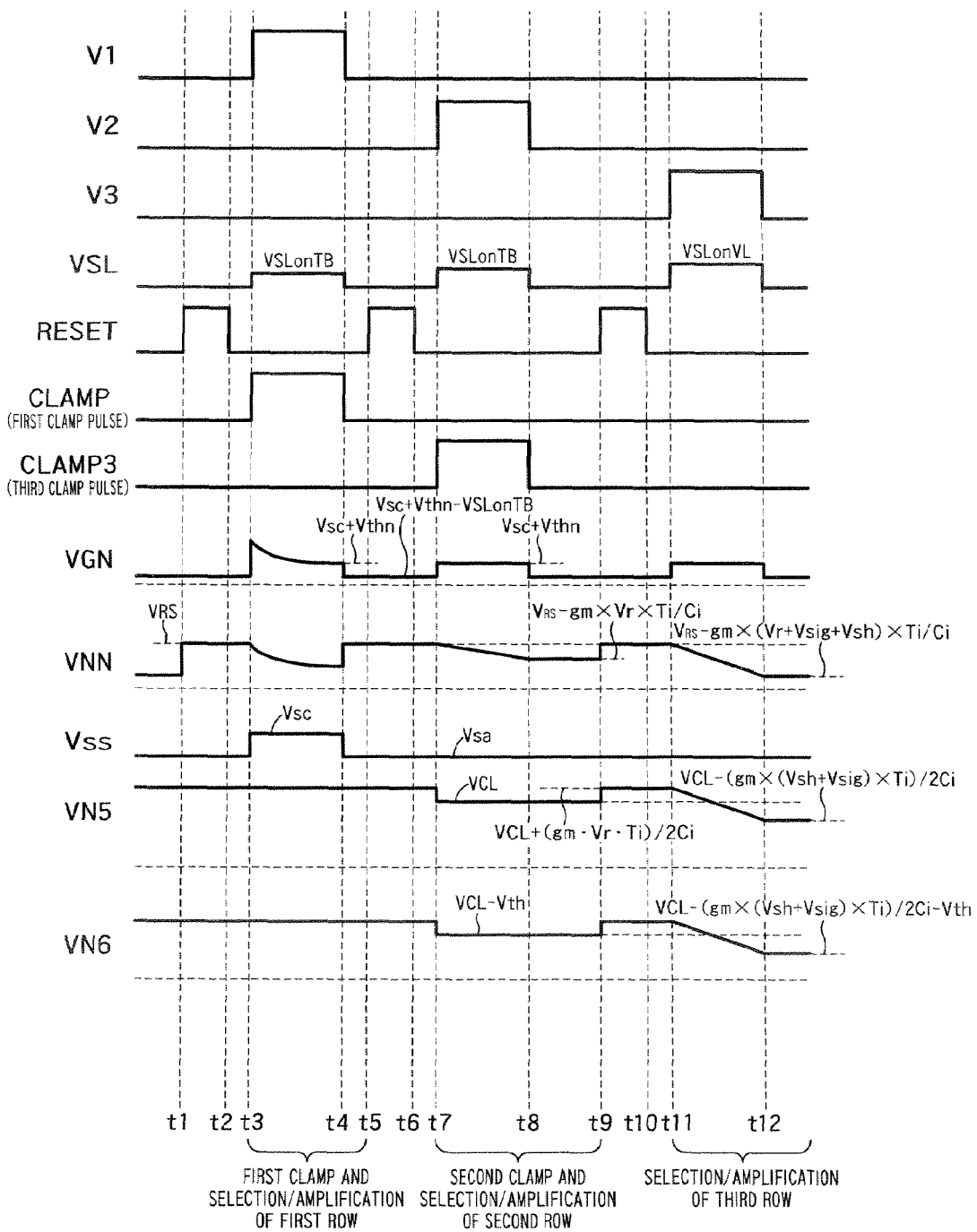
FIG. 16 is a timing chart showing the operation of the infrared sensor 300.

FIG. 16 is a timing diagram showing the operation of the infrared sensor 300. The isolation signal ISO, the second clamp pulse CLAMP_P, the control voltage GATE_P, the fourth node potential VGP, and the third node potential VNP are similar to those shown in FIG. 10, and are, therefore, omitted from FIG. 16. Vss represents a source voltage of the first amplifying transistor 72. Vss is Vsc during the first clamp operation, and is Vsa during other period.

After the reset operation of the first node N1, the first clamp operation is executed simultaneously with the selection/amplification operation of the first row, during a period from t3 to t4. In this case, behaviors of the first node potential VNN and the second node potential VGN are similar to those shown in FIG. 10. By the first clamp operation, the second node potential VGN is clamped by Vsc+Vthn. Based on the selection operation of the TB pixel row, a potential difference between the clamped voltage Vsc+Vthn and the column voltage VSLonTB is stored in the first coupling capacitor 71. Accordingly, after the first clamp operation, a relationship of VGN=Vsc+Vthn−VSLonTB is obtained during the non-selection period when VSL=Vss=0.

During the first clamp operation period, the isolating transistor 88 is in the off state. During a period other than the first clamp operation, the isolating transistor 88 is in the on state. Therefore, after the first clamp operation, the gate voltage (the first node potential VNN) of the first amplifying transistor 72 and the gate voltage (the third node potential VNP) of the second amplifying transistor 82 are substantially VRS.

After the reset operation, the second clamp operation is executed simultaneously with the selection/amplification operation of the second row, during a period from t7 to t8. In the second clamp operation, the third clamp pulse CLAMP3 becomes high. Accordingly, the third clamp transistor 79 is turned on, and the fifth node potential VN5 is clamped at VCL.

In this case, the pixels of the second row are the TB pixels, like the pixels of the first row. Therefore, ideally, a signal voltage is not generated, and the first node potential VNN remains unchanged from VRS.

However, actually, the first node potential VNN can be given by the expression 17 using the reset noise Vr.

$$VNN = VRS - (gm \cdot Vr \cdot Ti)/Ci \quad \text{(Expression 17)}$$

Based on the second clamp operation, the first storage capacitor 74 stores a potential difference between the voltage $VNN = VRS - (gm \cdot Vr \cdot Ti)/Ci$ based on the reset noise Vnr and the clamp voltage VCL. Accordingly, after the reset operation during a period from t9 to t10, the fifth node potential VN5 changes from VCL to $VCL - (gm \cdot Vr \cdot Ti)/2Ci$. A factor of ½ is obtained by assuming capacitance of the first storage capacitor 74 is equal to that of the third storage capacitor 78.

During a period from t11 to t12, the valid pixel row of the third row is selected, and the amplification of the infrared signal component is carried out. In this case, the first node potential VNN becomes $VNN = VRS - gm \cdot (Vr + Vsig + Vsh) \cdot Ti/Ci$ including the reset noise component. However, because the fifth node potential VN5 is clamped at the potential considering the reset noise Vr as described above, the fifth node potential VN5 changes to a potential obtained by canceling the reset noise Vr component from the voltage $VCL - gm \cdot (Vr + Vsig + Vsh) \cdot Ti/2Ci$. In other words, the fifth node potential VN5 becomes a potential different from VCL by the infrared signal component $gm \cdot (Vsig + Vsh) \cdot Ti/2Ci$.

The driving transistor 701 and the load transistor 702 buffer the fifth node potential VN5, and output this to the reading circuit 11. In FIG. 16, Vth is a threshold voltage of the driving transistor 701.

As explained above, the infrared sensor 300 according to the eighth embodiment can remove the reset noise Vnr component inside the column amplifier 107. Therefore, the infrared sensor 300 can have a wider dynamic range.

Furthermore, the storage circuit and the difference processing circuit in the external circuit (such as a camera circuit) of the infrared sensor 300 can be excluded. As a result, the cost of products (such as infrared cameras) having the infrared sensor 300 can be decreased.

In the eighth embodiment, TB pixels are provided as the first and the second row pixels. Accordingly, the reset noise Vnr component can be removed by only adding the simple third clamp circuit CL 3 to the column amplifier, as shown in FIG. 15. When a TB pixel row can be selected by plural times, the first clamp operation and the second clamp operation can be executed by using the TB pixels in one row.

NINTH EMBODIMENT

Figure 17:
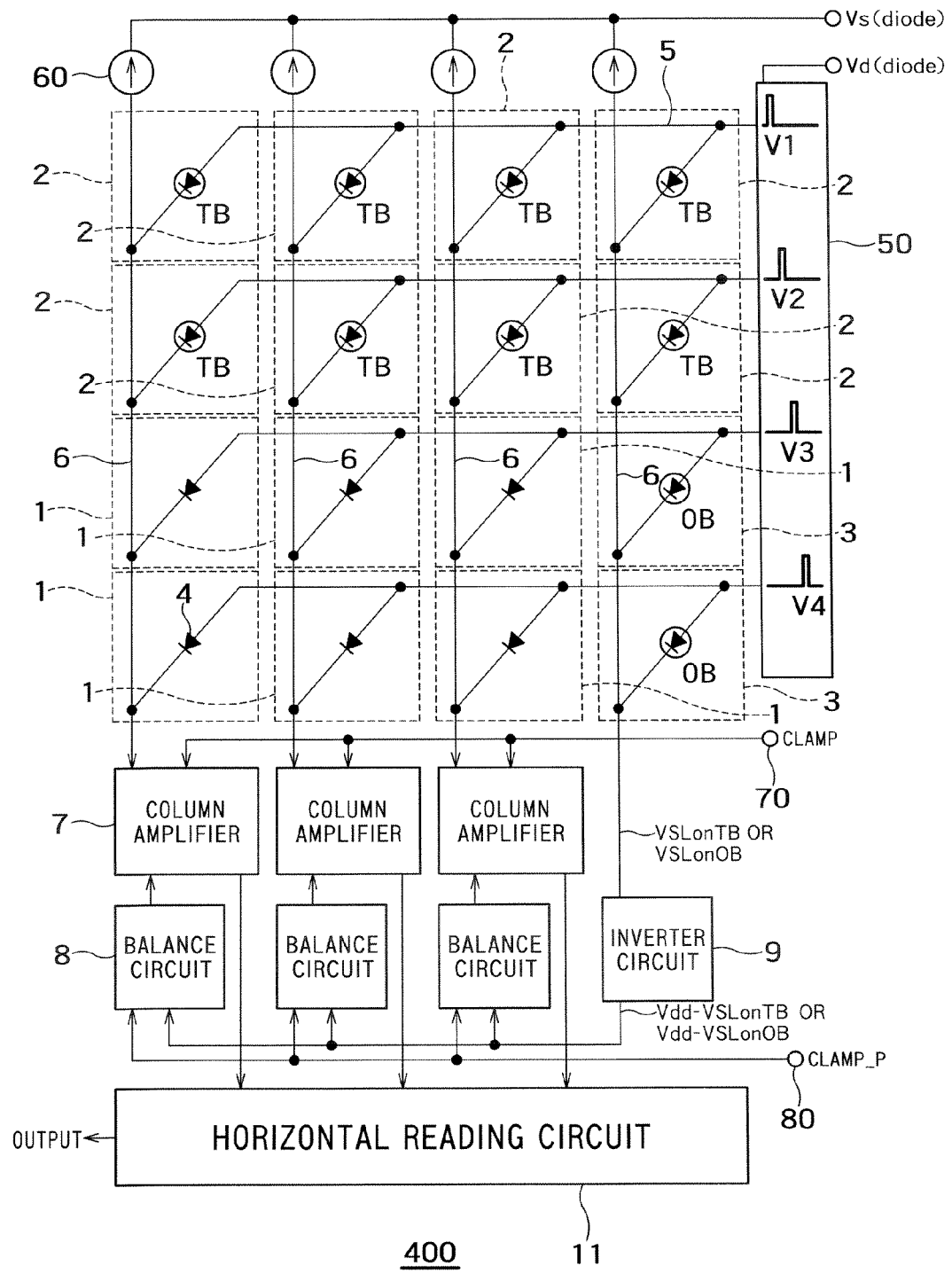
FIG. 17 is a diagram showing an infrared sensor 400 according to a ninth embodiment.

FIG. 17 is an explanatory diagram showing an infrared sensor 400 according to a ninth embodiment. In the ninth embodiment, the column amplifier 107 according to the eighth embodiment is applied to the infrared sensor 200 shown in FIG. 11. Pixels of the second row in the imaging area are TB pixels.

Figure 18:
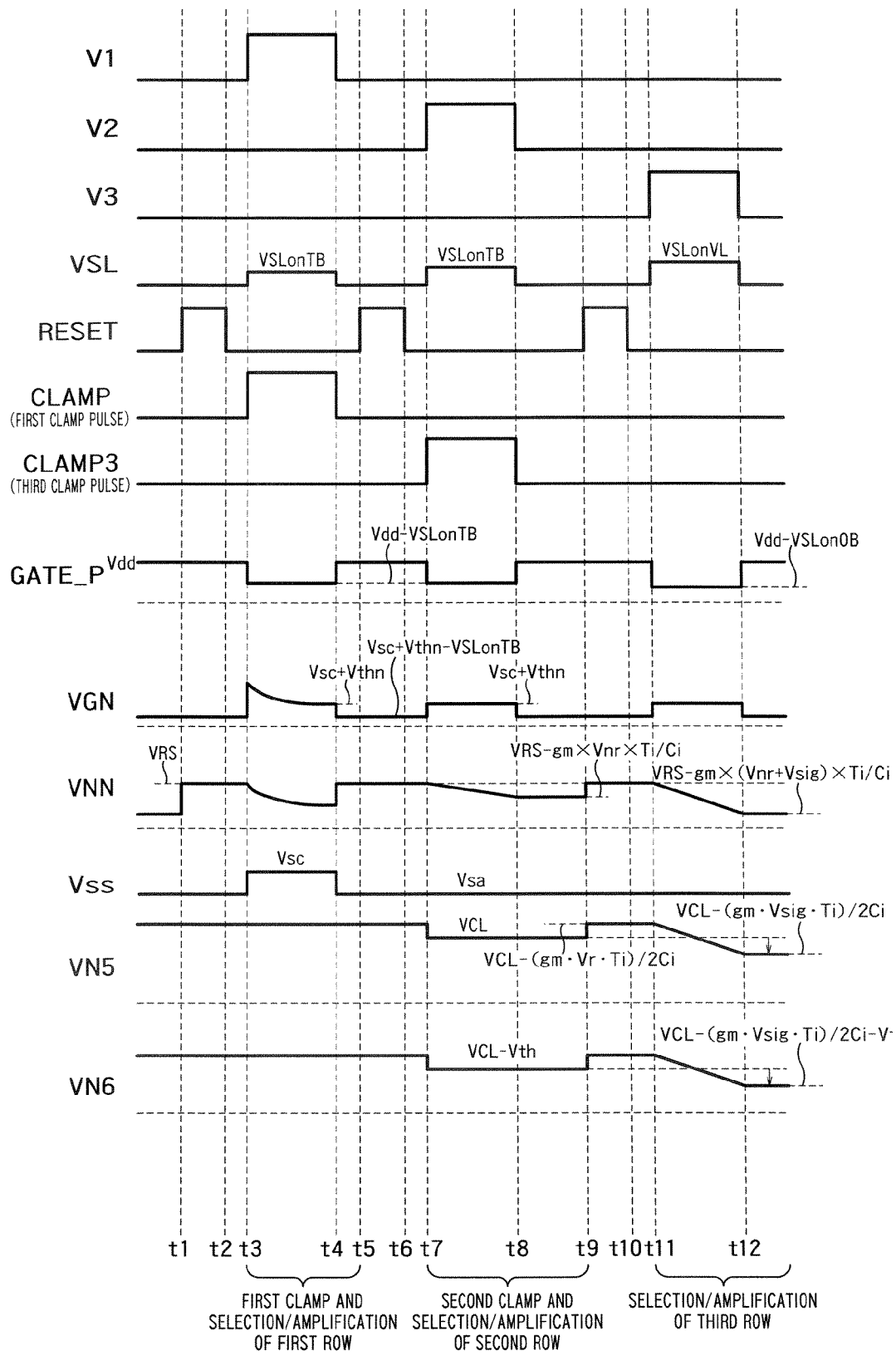
FIG. 18 is a timing chart showing the operation of the infrared sensor 400.

FIG. 18 is a timing diagram of the infrared sensor 400. In the ninth embodiment, the inverter circuit 9 supplies the control voltage GATE_P to the balance circuit 8. The control voltage GATE_P is Vdd−VSLonTB during the first clamp operation and the second clamp operation, and is Vdd−VSLonOB during the selection of the third row. During other period, the control voltage GATE_P is Vdd.

Accordingly, like in the fifth embodiment, the balance circuit 8 can supply a hole current to the column amplifier 7 to offset the self heating component Vsh. In other words, in the ninth embodiment, a bias component, a self heating component, and a reset noise component can be removed from the column amplifier output.

In the ninth embodiment, the external circuit (such as a camera circuit) of the infrared sensor 400 can be more simplified. As a result, the cost of products (such as infrared cameras) having the infrared sensor 400 can be further decreased.

In place of the horizontal reading circuit 11, a column AD converter can be used to digitalize the output of the column amplifier. Furthermore, conductivity of the transistors and the diodes shown in the above embodiments can be inverted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. An infrared sensor comprising:
    an imaging area disposed on a semiconductor substrate and including a plurality of infrared detection pixels which detect infrared rays;
    row selection lines connected to the infrared detection pixels disposed in a row direction;
    a signal line connected to the infrared detection pixels disposed in a column direction;
    a constant current source connected to the signal line;
    a row selection ciruit applying a voltage to the infrared detection pixels via the row selection line and generating a column voltage in the signal line;
    a column amplifier connected to the signal line, the column amplifier including a first amplifying transistor which generates an amplification voltage obtained by amplifying the column voltage and a first clamp ciruit which holds threshold voltage information of the first amplifying transistor in a gate of the first amplifying transistor;
    a removing ciruit including a second amplifying transistor which has conductivity opposite to that of the first amplifying transistor and a second clamp ciruit which holds threshold voltage information of the second amplifying transistor in a gate of the second amplifying transistor, the removing ciruit being connected to the column amplifier to remove a bias component generated by a bias current, which flows through the column amplifier, from the amplification voltage; and
    a reading ciruit reading an output voltage from the column amplifier, the output voltage being obtained by excluding at least the bias component from the amplification voltage.

2. The infrared sensor according to claim 1, wherein
the column amplifier includes
a first node connected to a drain of the first amplifying transistor,
a second node connected to a gate of the first amplifying transistor,
a first coupling capacitor coupled between the second node and the signal line and transmitting the column voltage to a gate of the first amplifying transistor,
a reset transistor connected to the first node and resetting a potential of the first node to a reset voltage, and
a first storage capacitor connected to the first node and storing a first charge which flows through the first amplifying transistor,
the removing ciruit includes
a control voltage input supplying a control voltage,
a third node connected to a drain of the second amplifying transistor,
a fourth node connected to a gate of the second amplifying transistor,
an isolation switch isolating between the third node and the first node during a clamp operation and connecting between the third node and the first node during a period other than the clamp operation period,
a second coupling capacitor connected to between the control voltage input and the fourth node and transmitting the control voltage to a gate of the second amplifying transistor, and
a second storage capacitor connected to the third node and storing a second charge having reverse polarity to that of the first charge, the second storage capacitor storing the second charge based on the control voltage amplified by the second amplifying transistor, and
the removing ciruit cancels the first charge with the second charge through the isolating switch.

3. The infrared sensor according to claim 2, wherein
the imaging area includes at least one optical non-sensitivity pixel column, and
the infrared sensor further comprises a control voltage generator generating the control voltage based on a signal voltage from the optical non-sensitivity pixel string.

4. The infrared sensor according to claim 2, wherein
the column amplifier comprises a third clamp ciruit connected to the first node via the first storage capacitor and outputting the output voltage obtained by subtracting reset noise attributable to the first coupling capacitor and to the second capacitor from the amplification voltage.

5. The infrared sensor according to claim 4, wherein
the third clamp ciruit comprises:
a fifth node connected to one electrode of the first storage capacitor;
a third clamp ciruit connected to the fifth node and clamping the fifth node at a clamp voltage;
a third storage capacitor connected to the fifth node; and
a buffer ciruit connected to between the fifth node and the reading ciruit and outputting a voltage of the fifth node to the reading ciruit.

6. The infrared sensor according to claim 4, wherein
the imaging area includes at least two rows constituted by thermal non-sensitivity pixels.

7. The infrared sensor according to claim 2, wherein
the isolation transistor is set to an off state when the first clamp ciruit and the second clamp ciruit are set to an on state, the isolation transistor is set to an on state when the first clamp ciruit and the second clamp ciruit are set to an off state.

8. The infrared sensor according to claim 1, wherein
a mutual conductance of the first amplifying transistor is equal to a mutual conductance of the second amplifying transistor.

9. The infrared sensor according to claim 1, wherein
the imaging area includes a row constituted by thermal non-sensitivity pixels.

10. The infrared sensor according to claim 1, wherein
pulse signals are applied to a source of the first amplifying transistor and to a source of the second amplifying transistor.

11. The infrared sensor according to claim 10, wherein $|Vdc-Vsc|<|Vda-Vsa|$ where Vsc represents a source voltage of the first amplifying transistor during a clamp operation carried out by the first clamp ciruit, Vdc represents a source voltage of the second amplifying transistor during a clamp operation carried out by the first clamp ciruit, Vsa represents a source voltage of the first amplifying transistor during an amplification operation carried out by the column amplifier, and Vda represents a source voltage of the second amplifying transistor during an amplification operation carried out by the column amplifier.

12. A driving method of an infrared sensor, the infrared sensor comprising an imaging area disposed on a semiconductor substrate and including a plurality of infrared detection pixels which detect infrared rays, row selection lines connected to the infrared detection pixels disposed in a row direction, a signal line connected to the infrared detection pixels disposed in a column direction, a constant current source connected to the signal line, a row selection circuit connected to the row selection lines, a column amplifier connected to the signal line, a removing circuit connected to the column amplifier, and a reading circuit connected to an output of the column amplifier,
the method comprising:
applying a voltage to the infrared detection pixels via the row selection line by using the row selection circuit, thereby generating a column voltage;
generating the amplification voltage obtained by amplifying the column voltage in the column amplifier;
removing a bias component, which is generated by a bias current flowing through the column amplifier, from the amplification voltage by using the removing circuit,
wherein the removing circuit includes a second amplifying transistor which has conductivity opposite to that first amplifying transistor and a clamp circuit which holds threshold voltage information of the second amplifying transistor in a gate of the second amplifying transistor, the removing circuit being connected to the column amplifier to remove a bias component generated by a bias currently, which flows through the column amplifier, from an amplification voltage; and
outputting the output voltage, which is obtained by removing the bias component from the amplification voltage, from the column amplifier to the reading circuit.

13. The method according to claim 12, wherein
the column amplifier includes a first amplifier transistor amplifying the column voltage, a first node connected to a drain of the first amplifier transistor, a second node connected to a gate of the first amplifier transistor, a first coupling capacitor coupled between the second node and the signal line, a first clamp ciruit connected to between the first node and the second node, a first storage capacitor connected to the first node, and a reset transistor connected to the first node, the method further comprising:

setting the isolation switch to an on state to connect electrically between the first node and the third node;

resetting a potential of the first node and a potential of the third node to a reset voltage by using the reset transistor;

setting the isolation switch to an off state;

connecting electrically between the first node and the second node by using the first clamp circuit, and connecting electrically the third node and the fourth node by using the second clamp ciruit to clamp the second node and the fourth node at a voltage including threshold value information of the first and the second transistors, respectively;

setting the first clamp ciruit and the second clamp ciruit to an off state, and setting the isolation switch to an on state;

inputting the column voltage via the first coupling capacitor to the first amplifying transistor to generate an amplification voltage by amplifying the column voltage;

inputting a control voltage from the control voltage input to the second amplifying transistor to generate a voltage equal to the bias component;

storing a first charge based on the amplification voltage in the first storage capacitor, and storing a second charge, which has reverse polarity to that of the first charge, by a quantity based on the bias component in the second storage capacitor to extinguish a quantity of the first charge corresponding to the bias component with the second charge through the isolation switch; and outputting a voltage of the first node as the output voltage.

14. The method according to claim 13, wherein the isolation switch is in an off state during a period of clamp operation of the second node and the fourth node, and the isolation switch is in an on state during a period other than the clamp operation period.

15. The method according to claim 13, wherein $|Vdc-Vsc|<|Vda-Vsa|$ where Vsc represents a source voltage of the first amplifying transistor during a clamp operation carried out by the first clamp ciruit, Vdc represents a source voltage of the second amplifying transistor during a clamp operation carried out by the first clamp ciruit, Vsa represents a source voltage of the first amplifying transistor during an amplification operation carried out by the column amplifier, and Vda represents a source voltage of the second amplifying transistor during an amplification operation carried out by the column amplifier.

16. The method according to claim 13, wherein at least one thermal non-sensitivity pixel row is disposed in the imaging area, and the clamp operation of the second node and the fourth node is executed during a period while the thermal non-sensitivity pixel row is selected.

17. The method according to claim 12, wherein the imaging area includes a thermal non-sensitivity pixel row, the column amplifier includes a first amplifier transistor amplifying the column voltage, a first node connected to a drain of the first amplifier transistor, a second node connected to a gate of the first amplifier transistor, a first coupling capacitor coupled between the second node and the signal line, a first clamp ciruit connected to between the first node and the second node, a first storage capacitor connected to the first node, a reset transistor connected to the first node, and a third clamp ciruit connected to the first node via the first storage capacitor, the method further comprising:

the removing ciruit includes a second amplifier transistor having conductivity opposite to that of the first amplifier transistor, a third node connected to a drain of the second amplifying transistor, a fourth node connected to a gate of the second amplifying transistor, a second coupling capacitor coupled between the fourth node and a control voltage input which controls a gate voltage of the second amplifying transistor, a second clamp ciruit connected to between the third node and the fourth node, a second storage capacitor connected to the third node, and an isolation switch connected to between the third node and the first node;

setting the isolation switch to an on state to connect electrically between the first node and the third node;

resetting a potential of the first node and a potential of the third node to a reset voltage by the reset transistor;

setting the isolation switch to an off state during a period while the thermal non-sensitivity pixel row is selected;

connecting electrically between the first node and the second node by using the first clamp ciruit and connecting electrically between the third node and the fourth node by using the second clamp ciruit to clamp the second node and the fourth node at a voltage including threshold value information of the first and the second transistors, respectively;

setting the first clamp ciruit and the second clamp ciruit to an off state, and setting the isolation switch to an on state;

during a period while the thermal non-sensitivity pixel row is selected again;

inputting the column voltage from the thermal non-sensitivity pixel row to the first amplifying transistor via the first coupling capacitor to generate an amplification voltage by amplifying the column voltage;

inputting a control voltage from the control voltage input to the second amplifying transistor to generate a voltage equal to the bias component;

storing a first charge based on the amplification voltage in the first storage capacitor, and storing a second charge, which has reverse polarity to that of the first charge, by a quantity based on the bias component in the second storage capacitor to extinguish a quantity of the first charge corresponding to at least the bias component with the second charge through the isolation switch;

removing reset noise, which is attributable to the first coupling capacitor and the second coupling capacitor, from the amplification noise by using the third clamp circuit;and outputting the amplification voltage as the output voltage from the column amplifier after removing the reset noise.

18. The method according to claim 17, wherein the third clamp circuit includes a fifth node connected to one electrode of the first storage capacitor, a third clamp circuit connected to the fifth node, a third storage capacitor connected to the fifth node, and a buffer circuit connected to between the fifth node and the reading circuit, the method further comprising:

resetting a potential of the first node to a reset voltage by the reset transistor, after clamp operation of the second node and amplification operation of the first amplifying transistor;

clamping the fifth node at a clamp voltage by setting the third clamp to an on state and inputting the column voltage from the thermal non-sensitivity pixel to the first amplifying transistor via the first coupling capacitor to generate an amplification voltage obtained by amplifying the column voltage;

setting the fifth node to a clamp voltage in a state that a voltage including the reset noise is held in the first node;

setting the third clamp circuit to an off state;

resetting a potential of the first node to the reset voltage of by the reset transistor;

inputting the column voltage from the infrared detection pixels to the first amplifying transistor via the first coupling capacitor to generate an amplification voltage by amplifying the column voltage;

generating an infrared signal component, which is obtained by subtracting a voltage corresponding the reset noise from the amplification voltage, at the fifth node; and outputting a voltage of the fifth node from the buffer circuit to the reading circuit.

19. The method according to claim 18, wherein the operation of holding a voltage including the reset noise in the first storage capacitor is executed for each frame.

20. The method according to claim 19, wherein $|Vdc-Vsc|<|Vda-Vsa|$ where Vsc represents a source voltage of the first amplifying transistor during a clamp operation at the first node, Vdc represents a source voltage of the second amplifying transistor during a clamp operation at the first node, Vsa represents a source voltage of the first amplifying transistor during an amplification operation at the fifth node, and Vda represents a source voltage of the second amplifying transistor during an amplification operation at the fifth node.

21. An infrared camera comprising:

an imaging area disposed on a semiconductor substrate and including a plurality of infrared detection pixels which detect infrared rays;

row selection line connected to the infrared detection pixels disposed in a row direction;

a signal line connected to the infrared detection pixels disposed in a column direction;

a constant current source connected to the signal line;

a row selection circuit applying a voltage to the infrared detection pixels via the row selection line and generating a column voltage in the signal line;

a column amplifier connected to the signal line, the column amplifier including a first amplifying transistor which generates an amplification voltage obtained by amplifying the column voltage and a first clamp circuit which holds threshold voltage information of the first amplifying transistor in a gate of the first amplifying transistor;

a removing circuit including a second amplifying transistor which has conductivity opposite to that of the first amplifying transistor and a second clamp circuit which holds threshold voltage information of the second amplifying transistor in a gate of the second amplifying transistor, the removing circuit being connected to the column amplifier to remove a bias component generated by a bias current, which flows through the column amplifier, from the amplification voltage; and a reading ciruit reading an output voltage from the column amplifier, the output voltage being obtained by excluding at least the bias component from the amplification voltage.

22. A driving method of an infrared camera, the infrared sensor comprising an imaging area disposed on a semiconductor substrate and including a plurality of infrared detection pixels which detect infrared rays, row selection lines connected to the infrared detection pixels disposed in a row direction, a signal line connected to the infrared detection pixels disposed in a column direction, a constant current source connected to the signal line, a row selection grit connected to the row selection lines, a column amplifier connected to the signal line, a removing grit connected to the column amplifier, and a reading grit connected to an output of the column amplifier, the method comprising:

applying a voltage to the infrared detection pixels via the row selection line by using the row selection grit, thereby generating a column voltage;

generating the amplification voltage obtained by amplifying the column voltage in the column amplifier;

removing a bias component, which is generated by a bias current flowing through the column amplifier, from the amplification voltage by using the removing circuit, wherein the removing ciruit includes a second transistor which has conductivity opposite to that first amplifying transistor and a clamp ciruit which holds threshold voltage information of the second amplifying transistor in a gate of the second amplifying transistor, the removing ciruit being connected to the column amplifier to remove a bias component generated by a bias currently, which flows through the column amplifier, from an amplification voltage; and outputting the output voltage, which is obtained by removing the bias component from the amplification voltage, from the column amplifier to the reading ciruit; and reading the output voltage from the column amplifier in the reading ciruit.

* * * * *